(12) United States Patent
Berman et al.

(10) Patent No.: US 9,858,994 B2
(45) Date of Patent: Jan. 2, 2018

(54) MEMORY SYSTEM WITH MLC MEMORY CELLS AND PARTIAL PAGE COMPRESSION OR REDUCTION

(71) Applicant: Samsung Electronics Co., Ltd., Suwon-si, Gyeonggi-do (KR)

(72) Inventors: Amit Berman, Ramat Gan (IL); Jun Jin Kong, Yongin-si (KR); Uri Beitler, Ramat Gan (IL)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 120 days.

(21) Appl. No.: 14/743,445

(22) Filed: Jun. 18, 2015

(65) Prior Publication Data

US 2016/0371028 A1 Dec. 22, 2016

(51) Int. Cl.
*G11C 11/56* (2006.01)
*G06F 12/00* (2006.01)
*G11C 16/26* (2006.01)
*G11C 7/10* (2006.01)
*G11C 16/04* (2006.01)

(52) U.S. Cl.
CPC .......... *G11C 11/5642* (2013.01); *G06F 12/00* (2013.01); *G06F 2212/401* (2013.01); *G06F 2212/7203* (2013.01); *G11C 7/1006* (2013.01); *G11C 16/0483* (2013.01); *G11C 16/26* (2013.01); *G11C 2211/5641* (2013.01)

(58) Field of Classification Search
CPC ................ G11C 11/5642; G11C 16/26; G11C 2211/5641; G11C 7/1006; G11C 16/0483; G06F 3/0611; G06F 3/0656; G06F 3/0679; G06F 12/0246; G06F 2212/401; G06F 2212/2022; G06F 2212/7203; G06F 12/00; G06F 3/0644; G06F 3/0608; G06F 3/0673

See application file for complete search history.

(56) References Cited

U.S. PATENT DOCUMENTS

| | | | |
|---|---|---|---|
| 6,836,432 B1 * | 12/2004 | Parker | G11C 11/5628 365/185.03 |
| 7,593,263 B2 | 9/2009 | Sokolov et al. | |
| 8,230,300 B2 * | 7/2012 | Perlmutter | G06F 11/1008 714/763 |
| 8,327,066 B2 | 12/2012 | Heo et al. | |
| 8,429,498 B1 | 4/2013 | Anholt et al. | |

(Continued)

*Primary Examiner* — Mark Giardino, Jr.
*Assistant Examiner* — Glenn Gossage
(74) *Attorney, Agent, or Firm* — Harness, Dickey & Pierce, P.L.C.

(57) ABSTRACT

A memory system includes a memory device, the memory device including a memory cell array and a compression encoder, the memory cell array including a first plurality of multi level cells (MLCs). The memory device is configured to generate a first partial page by performing one or more first sensing operations on the first plurality of MLCs using one or more first reference voltages, output the first partial page, generate a second partial page by performing a second sensing operation on the first plurality of MLCs based on a second reference voltage, the second reference voltage having a different voltage level than the one or more first reference voltages, generate a compressed second partial page by compressing the second partial page using the compression encoder, and output the compressed second partial page.

17 Claims, 19 Drawing Sheets

(56) References Cited

U.S. PATENT DOCUMENTS

| | | | |
|---|---|---|---|
| 8,458,568 B2 | 6/2013 | Cideciyan et al. | |
| 8,533,564 B2 | 9/2013 | Yurzola et al. | |
| 8,665,643 B2 | 3/2014 | Kim et al. | |
| 2008/0037321 A1* | 2/2008 | Luo | G06F 8/65 365/185.03 |
| 2009/0185425 A1* | 7/2009 | Ravasio | B82Y 10/00 365/185.18 |
| 2009/0190396 A1* | 7/2009 | Cho | G11C 11/5642 365/185.03 |
| 2010/0011150 A1* | 1/2010 | Klein | G06F 12/0246 711/103 |
| 2011/0072201 A1 | 3/2011 | Lee et al. | |
| 2011/0199822 A1* | 8/2011 | Yoon | G11C 11/5628 365/185.03 |
| 2013/0117630 A1* | 5/2013 | Kang | G06F 11/1048 714/763 |
| 2013/0322175 A1* | 12/2013 | Kong | G11C 16/10 365/185.11 |
| 2014/0040531 A1 | 2/2014 | Wu et al. | |
| 2014/0047163 A1* | 2/2014 | Kwak | G06F 12/0246 711/103 |
| 2014/0157086 A1 | 6/2014 | Sharon et al. | |
| 2014/0173174 A1* | 6/2014 | Frickey | G11C 11/5628 711/103 |
| 2015/0228344 A1* | 8/2015 | Park | G11C 16/12 711/103 |
| 2015/0254132 A1* | 9/2015 | Murakami | G06F 11/1048 714/764 |

\* cited by examiner

FIG. 2
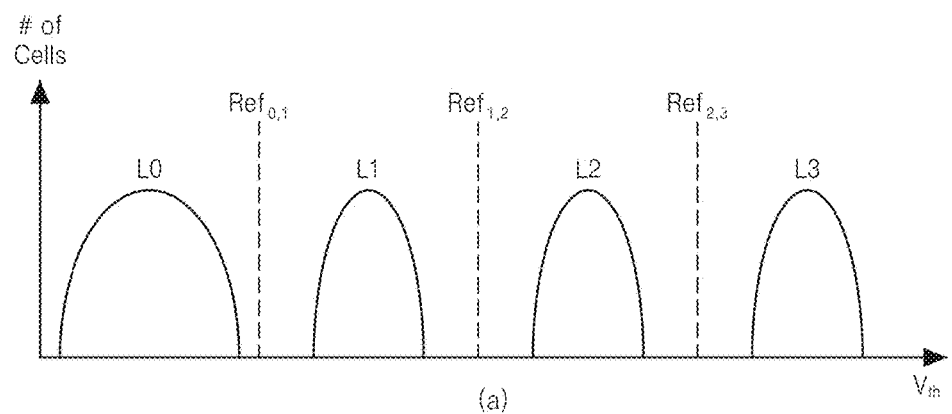
(a)
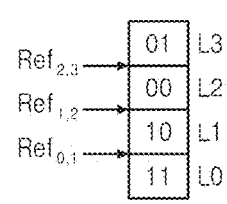
(b)
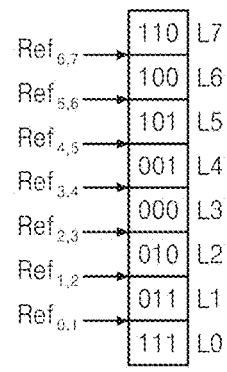
(d)
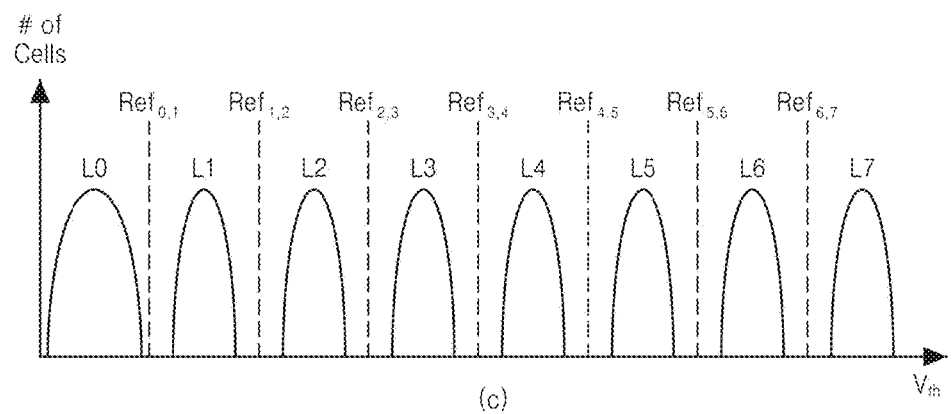
(c)

| 41 | 43 | 45 | 47 | 49 |
|----|----|----|----|----|
| 00 | 00 | 10 | 11 | 01 |

FIG. 4D

Page$_{0,1}$ of cells 40

| 0 | 0 | 0 | 1 | 0 |
|---|---|---|---|---|

Page$_{2,3}$ of cells 40

| 0 | 0 | 0 | 0 | 1 |
|---|---|---|---|---|

RPage$_{2,3}$ of cells 40

| 0 | 0 | 0 | X | 1 |
|---|---|---|---|---|

LSB Data Page of cells 40

| 0 | 0 | 0 | 1 | 1 |
|---|---|---|---|---|

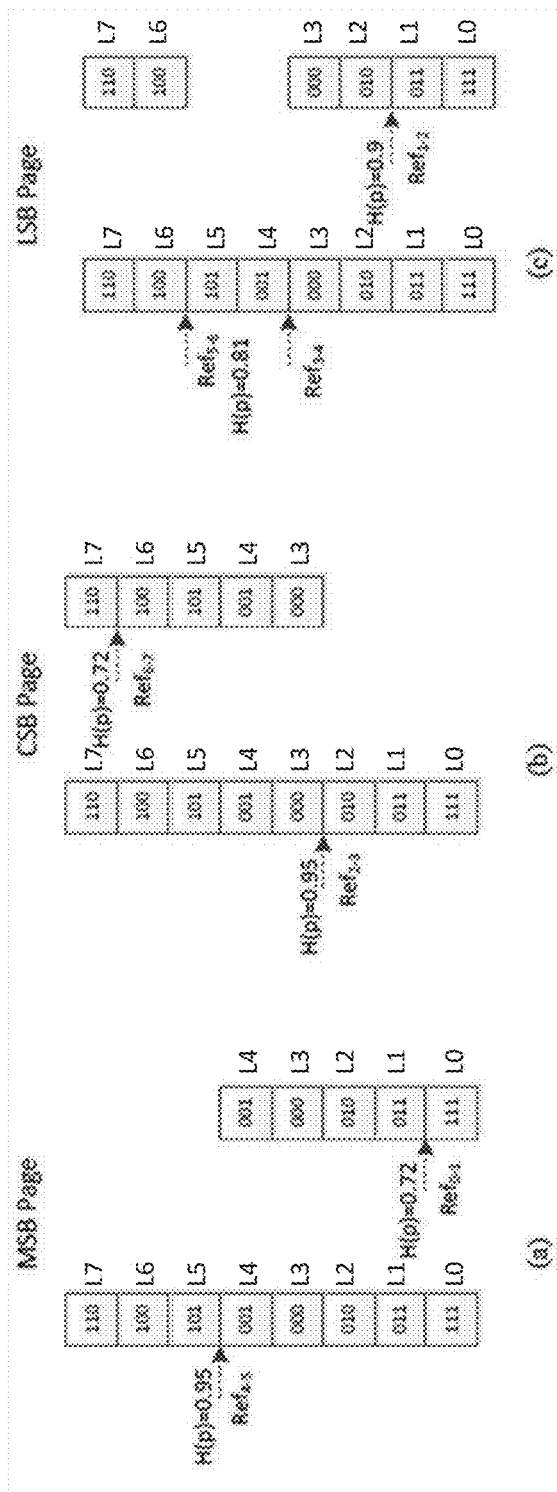
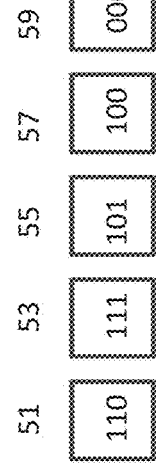
FIG. 5B
FIG. 5A

FIG. 5C

Page$_{3,4}$ of cells 50

| 1 | 0 | 1 | 1 | 0 |

Page$_{5,6}$ of cells 50

| 0 | 1 | 1 | 0 | 1 |

Page$_{1,2}$ of cells 50

| 0 | 1 | 0 | 0 | 0 |

Part1and2 of cells 50

| 0 | 0 | 1 | 0 | 0 |

RPage$_{1,2}$ of cells 50

| 0 | 1 | X | 0 | 0 |

LSB Data Page of cells 50

| 0 | 1 | 1 | 0 | 0 |

Source distribution p(1)=0.2, p(0)=0.8;   Entropy=0.72

| Input length | # of codewords | Compression | Gap from entropy |
|---|---|---|---|
| 2 | 4 | 0.78 | 0.06 |
| 3 | 8 | 0.728 | 0.008 |
| 4 | 16 | 0.74 | 0.02 |
| 5 | 32 | 0.737 | 0.017 |
| 6 | 64 | 0.725 | 0.005 |

(a)

Source distribution p(1)=0.375, p(0)=0.625;   Entropy=0.95

| Input length | # of codewords | Compression | Gap from entropy |
|---|---|---|---|
| 2 | 4 | 0.992 | 0.181 |
| 3 | 8 | 0.965 | 0.154 |
| 4 | 16 | 0.967 | 0.156 |
| 5 | 32 | 0.959 | 0.148 |
| 6 | 64 | 0.96 | 0.149 |

(b)

Source distribution p(1)=0.25, p(0)=0.75;   Entropy=0.811

| Input length | # of codewords | Compression | Gap from entropy |
|---|---|---|---|
| 2 | 4 | 0.843 | 0.032 |
| 3 | 8 | 0.822 | 0.011 |
| 4 | 16 | 0.818 | 0.007 |
| 5 | 32 | 0.818 | 0.007 |
| 6 | 64 | 0.818 | 0.007 |

(c)

Source distribution p(1)=0.33, p(0)=0.66;   Entropy=0.91

| Input length | # of codewords | Compression | Gap from entropy |
|---|---|---|---|
| 2 | 4 | 0.945 | 0.035 |
| 3 | 8 | 0.938 | 0.028 |
| 4 | 16 | 0.938 | 0.028 |
| 5 | 32 | 0.923 | 0.013 |
| 6 | 64 | 0.933 | 0.023 |

Huffman code for p(1)=0.2, p(0)=0.8;  Entropy=0.72

| Input | Output | Length | Prob | Length x Prob |
|---|---|---|---|---|
| 000 | 1 | 1 | 0.5120 | 0.512 |
| 001 | 010 | 3 | 0.1280 | 0.384 |
| 010 | Same Encoder as p(1)=0.25, p(0)=0.75 | 3 | 0.1280 | 0.384 |
| 011 | | 5 | 0.0320 | 0.16 |
| 100 | | 3 | 0.1280 | 0.384 |
| 101 | | 5 | 0.0320 | 0.16 |
| 110 | | 5 | 0.0320 | 0.16 |
| 111 | | 5 | 0.0080 | 0.04 |

Rate  2.18/3=0.72

(a)

Huffman code for p(1)=0.375, p(0)=0.625;  Entropy=0.95

| Input | Output | Length | Prob | Length x Prob |
|---|---|---|---|---|
| 000 | 11 | 2 | 0.2440 | 0.488 |
| 001 | 001 | 3 | 0.1460 | 0.438 |
| 010 | 010 | 3 | 0.1460 | 0.438 |
| 011 | 0001 | 4 | 0.0870 | 0.348 |
| 100 | 011 | 3 | 0.1460 | 0.438 |
| 101 | 100 | 3 | 0.0879 | 0.2637 |
| 110 | 101 | 3 | 0.0879 | 0.2637 |
| 111 | 0000 | 4 | 0.0520 | 0.208 |

Rate  2.88/3=0.96

(b)

Huffman code for p(1)=0.25, p(0)=0.75;  Entropy=0.811

| Input | Output | Length | Prob | Length x Prob |
|---|---|---|---|---|
| 000 | 1 | 1 | 0.4219 | 0.4219 |
| 001 | 010 | 3 | 0.1406 | 0.4218 |
| 010 | 001 | 3 | 0.1406 | 0.4218 |
| 011 | 01111 | 5 | 0.0469 | 0.2345 |
| 100 | 000 | 3 | 0.1406 | 0.4218 |
| 101 | 01110 | 5 | 0.0469 | 0.2345 |
| 110 | 01101 | 5 | 0.0469 | 0.2345 |
| 111 | 01100 | 5 | 0.0156 | 0.078 |

Rate  2.46/3=0.82

(c)

Huffman code for p(1)=0.333, p(0)=0.666;  Entropy=0.91

| Input | Output | Length | Prob | Length x Prob |
|---|---|---|---|---|
| 000 | Same Encoder as p(1)=0.375, p(0)=0.625 | 2 | 0.2963 | 0.5926 |
| 001 | | 3 | 0.1481 | 0.4443 |
| 010 | | 3 | 0.1481 | 0.4443 |
| 011 | | 4 | 0.0741 | 0.2964 |
| 100 | | 3 | 0.1481 | 0.4443 |
| 101 | | 3 | 0.0741 | 0.2223 |
| 110 | | 3 | 0.0741 | 0.2223 |
| 111 | | 4 | 0.0370 | 0.148 |

Rate  2.81/3=0.93

Source distribution p(1)=0.125, p(0)=0.875;   Entropy=0.543

| Input length | # of codewords | Compression | Gap from entropy |
|---|---|---|---|
| 2 | 4 | 0.679 | 0.136 |
| 3 | 8 | 0.582 | 0.039 |
| 4 | 16 | 0.557 | 0.014 |
| 5 | 32 | 0.549 | 0.006 |
| 6 | 64 | 0.547 | 0.004 |

Huffman code for p(1)=0.125, p(0)=0.875;   Entropy=0.543

| Input | Output | Length | Prob | Length x Prob |
|---|---|---|---|---|
| 0000 | 1 | 1 | 0.5862 | 0.5862 |
| 0001 | 010 | 3 | 0.0837 | 0.2511 |
| 0010 | 001 | 3 | 0.0837 | 0.2511 |
| 0011 | 011000 | 6 | 0.0120 | 0.072 |
| 0100 | 000 | 3 | 0.0837 | 0.2511 |
| 0101 | 0110101 | 7 | 0.0120 | 0.084 |
| 0110 | 0110100 | 7 | 0.0120 | 0.084 |
| 0111 | 011001010 | 9 | 0.0017 | 0.0153 |
| 1000 | 0111 | 4 | 0.0837 | 0.3348 |
| 1001 | 0110111 | 7 | 0.012 | 0.084 |
| 1010 | 0110110 | 7 | 0.012 | 0.084 |
| 1011 | 011001001 | 9 | 0.0017 | 0.0153 |
| 1100 | 0110011 | 7 | 0.012 | 0.084 |
| 1101 | 011001000 | 9 | 0.0017 | 0.0153 |
| 1110 | 0110010111 | 10 | 0.0017 | 0.017 |
| 1111 | 0110010110 | 10 | 0.0002 | 0.002 |

Rate    2.23/4=0.55

LSB Data Page of cells 60

| 1 | 0 | 1 | 0 | 0 |

Page$_{0,1}$ of cells 60

| 0 | 0 | 1 | 0 | 0 |

RPage$_{0,1}$ of cells 60

| 0 | X | 1 | X | X |

Page$_{3,4}$ of cells 60

| 0 | 0 | 0 | 1 | 0 |

RPage$_{3,4}$ of cells 60

| X | 0 | X | 1 | 0 |

MSB Data Page of cells 60

| 0 | 0 | 1 | 1 | 0 |

MEMORY SYSTEM WITH MLC MEMORY CELLS AND PARTIAL PAGE COMPRESSION OR REDUCTION

BACKGROUND

1. Field

One or more example embodiments of the inventive concepts relate to methods and apparatuses for compressing and decompressing data in a memory system.

2. Related Art

NAND flash memory is one example of electrically erasable and programmable read only memory (EEPROM). A NAND flash memory may store large amounts of information in a small chip area by using NAND cell units where a plurality of memory cells are connected in series to each other.

NAND flash memory experiences a performance advantage over magnetic and optical storage in terms of read latency. For example, while example hard-disk and optical drive latencies may be 3 to 12 milliseconds (ms), an example flash nonvolatile memory (NVM) latency may range between 50 to 120 microseconds (µs).

SUMMARY

Provided are methods and apparatuses for reducing read latency in memory systems using compression of partial data pages.

According to at least one example embodiment of the inventive concepts, a memory system includes a memory device, the memory device including, a memory cell array, and a compression encoder, the memory cell array including a first plurality of multi level cells (MLCs), the memory device being configured to, generate a first partial page by performing one or more first sensing operations on the first plurality of MLCs using one or more first reference voltages, output the first partial page, generate a second partial page by performing a second sensing operation on the first plurality of MLCs based on a second reference voltage, the second reference voltage having a different voltage level than the one or more first reference voltages, generate a compressed second partial page by compressing the second partial page using the compression encoder, and output the compressed second partial page.

The memory device may be configured such that, the first partial page includes information for generating a first data page of the first plurality of MLCs, the second partial page includes information for generating the first data page of the first plurality of MLCs, and the first data page is one of a most significant bit (MSB) page, a least significant bit (LSB) page, or a central significant bit (CSB) page of the first plurality MLCs.

The compression encoder may be configured to compress information using Huffman encoding, and the memory device may be further configured to generate a first compressed partial page by compressing the first partial page generated by the memory device such that the first partial page output by the memory device is the first compressed partial page.

The memory device may be configured to perform the compression of the first partial page in parallel with performing the sensing of the second partial page.

The memory device may further include a page buffer configured to receive the generated first partial page and the generated second partial page from the memory cell array.

The memory system may further include a memory controller configured to, receive the first partial page output from the memory device, receive the compressed second partial page output from the memory device, decompress the compressed second partial page, and generate a first data page of the first plurality of MLCs based on the first partial page and the decompressed second partial page, the first data page being one of a most significant bit (MSB) page, a least significant bit (LSB) page, or a central significant bit (CSB) page of the first plurality of MLCs.

The memory controller may be configured to determine log likelihood ratio (LLR) information based on at least one of the first partial page and the decompressed second partial page, and generate the first data page of the first plurality of MLCs based on the first partial page, the decompressed second partial page, the determined LLR information.

The memory system may further include a memory system bus, wherein the memory device is configured to output the first partial page to the memory controller via the memory system bus, and the memory device is configured to output the compressed second partial page to the memory controller via the memory system bus, after outputting the first partial page to the memory controller via the memory system bus.

The memory controller may be configured to generate the first data page by performing one or more arithmetic operations based on the first partial page and the second partial page.

The memory device may be configured to determine one or more known data values based on the first partial page, and generate a reduced second partial page by omitting one or more bits of the second partial page generated by the memory device, such that, the one or more omitted bits are bits that correspond to the one or more known data values, the reduced second partial page includes no bits of data corresponding to MLCs, from among the first plurality of MLCs, that correspond to the one or more know data values, and the second partial page compressed by the memory device to generate the compressed second partial page is the reduced second partial page.

The memory controller may be configured to determine the one or more known data values based on the first partial page received by the memory controller, and generate the first data page by performing one or more arithmetic operations based on the first partial page, the second partial page, and the one or more known data values.

According to at least one example embodiment of the inventive concepts, a memory system includes a memory device, the memory device including, a memory cell array, the memory cell array including a first plurality of multi level cells (MLCs), the memory device being configured to, generate a first partial page by performing one or more first sensing operations on the first plurality of MLCs using one or more first reference voltages, determine one or more known data values based on the first partial page, output the first partial page, generate a second partial page by performing a second sensing operation on the first plurality of MLCs based on a second reference voltage, the second reference voltage having a different voltage level than the one or more first reference voltages, generate a second reduced partial page by omitting one or more bits of the second partial page generated by the memory device based on the known data values, output the second reduced partial page.

The memory system may further include a memory controller configured to receive the first partial page output from the memory device, determine the one or more known data values based on the received first partial page, receive the second reduced partial page output from the memory device, and generate a first data page of the first plurality of MLCs based on the first partial page, the second reduced partial page, and the one or more known data values, the first data page being one of a most significant bit (MSB) page, a least significant bit (LSB) page, or a central significant bit (CSB) page of the first plurality of MLCs.

The memory system may further include a memory system bus, wherein the memory device is configured to output the first partial page to the memory controller via the memory system bus, and the memory device is configured to output the second reduced partial page to the memory controller via the memory system bus, after outputting the first partial page to the memory controller via the memory system bus.

The memory device may be configured such that, the second partial page generated by the memory device includes a bit of binary information for each cell in the first plurality of MLCs, respectively, and the second reduced partial page includes a bit of binary information for each cell in the first plurality of MLCs except one or more cells of the first plurality of MLCs that correspond to the one or more known data values.

The memory device may be configured such that the second reduced partial page includes no bits of binary information for any cell or cells in the first plurality of MLCs that correspond to the one or more known data values.

The memory device may include a compression encoder, and the memory device may be configured to generate a compressed reduced partial page by compressing the second reduced partial page generated by the memory device, the reduced partial page output by the memory device being the compressed reduced partial page.

According to at least one example embodiment of the inventive concepts, a memory system include a memory device, the memory device including, a memory cell array, the memory cell array including a first plurality of multi level cells (MLCs), the memory device being configured to, generate a first data page of the first plurality of MLCs by performing one or more first sensing operations on the first plurality of MLCs using at least a first reference voltage, the first data page being a data page of a first data page type, the first data page type being one of a most significant bit (MSB) page type, least significant bit (LSB) page type, or a central significant bit (CSB) page type, output the first data page, sense a first partial page by performing a second sensing operation on the first plurality of MLCs based on a second reference voltage, the second reference voltage having a different voltage level than the first reference voltage, sense a second partial page by performing a third sensing operation on the first plurality of MLCs based on a third reference voltage, the third reference voltage having a different voltage level than the first and second reference voltages, output, as a first reduced partial page, all bits of the sensed first partial page except bits sensed from MLCs, of the plurality of MLC, determined by the memory device to store a threshold voltage state that is above the first reference voltage, output, as a second reduced partial page, all bits of the sensed second partial page except bits sensed from MLCs, of the plurality of MLC, determined by the memory device to store a threshold voltage state that is below the first reference voltage.

The memory system may further include a memory controller configured to receive the first data page output from the memory device, determine first information based on the received first data page, the first information indicating which of the first plurality of MLCs have a threshold voltage above the first reference voltage and which of the first plurality of MLCs have a threshold voltage below the first reference voltage, receive the first and second reduced partial pages output from the memory device, and generate a second data page of the first plurality of MLCs based on the first reduced partial page, the second reduced partial page, and the first information, the second data page being a data page of a second data page type, the second data page type being one of a most significant bit (MSB) page type, a least significant bit (LSB) page type, or a central significant bit (CSB) page type, the second data page type being different than the first data page type.

The memory system may further include a memory system bus, wherein the memory device is configured to output the first data page, and the first and second reduced data pages, to the memory controller via the memory system bus.

BRIEF DESCRIPTION OF THE DRAWINGS

Example embodiments of inventive concepts will be more clearly understood from the following detailed description taken in conjunction with the accompanying drawings in which:

FIG. 2 is a figure for explaining a mapping between multi level cell (MLC) data values and threshold voltage states according to at least one example embodiment of the inventive concepts.

FIG. 4B illustrates the contents of example memory cells of the memory cell array illustrated in FIG. 1A.

FIG. 4D is a diagram for explaining the formation of partial pages in a read operation involving 4-level MLCs according to at least one example embodiment of the inventive concepts.

FIG. 5A illustrates the contents of example memory cells of the memory cell array illustrated in FIG. 1A.

FIG. 5B is a diagram for explaining MSB, central significant bit (CSB), and LSB data page reading operations for MLCs storing 3-bit data.

FIG. 5C is a diagram for explaining the formation of partial pages in a read operation involving 8-level MLCs according to at least one example embodiment of the inventive concepts.

FIG. 6 shows tables comparing analytic word lengths vs. compression ratio results.

FIG. 7A shows tables explaining attributes of an example implementation of Huffman code for 3-bit inputs.

FIG. 7B shows a table comparing analytic word lengths vs. compression ratio results, and a table explaining attributes of an example implementation of Huffman code for 4-bit inputs.

FIG. 10C is a diagram for explaining the formation of partial pages in a read operation involving 4-level MLCs according to at least one example embodiment of the inventive concepts.

DETAILED DESCRIPTION OF EXAMPLE EMBODIMENTS

Figure 1A:
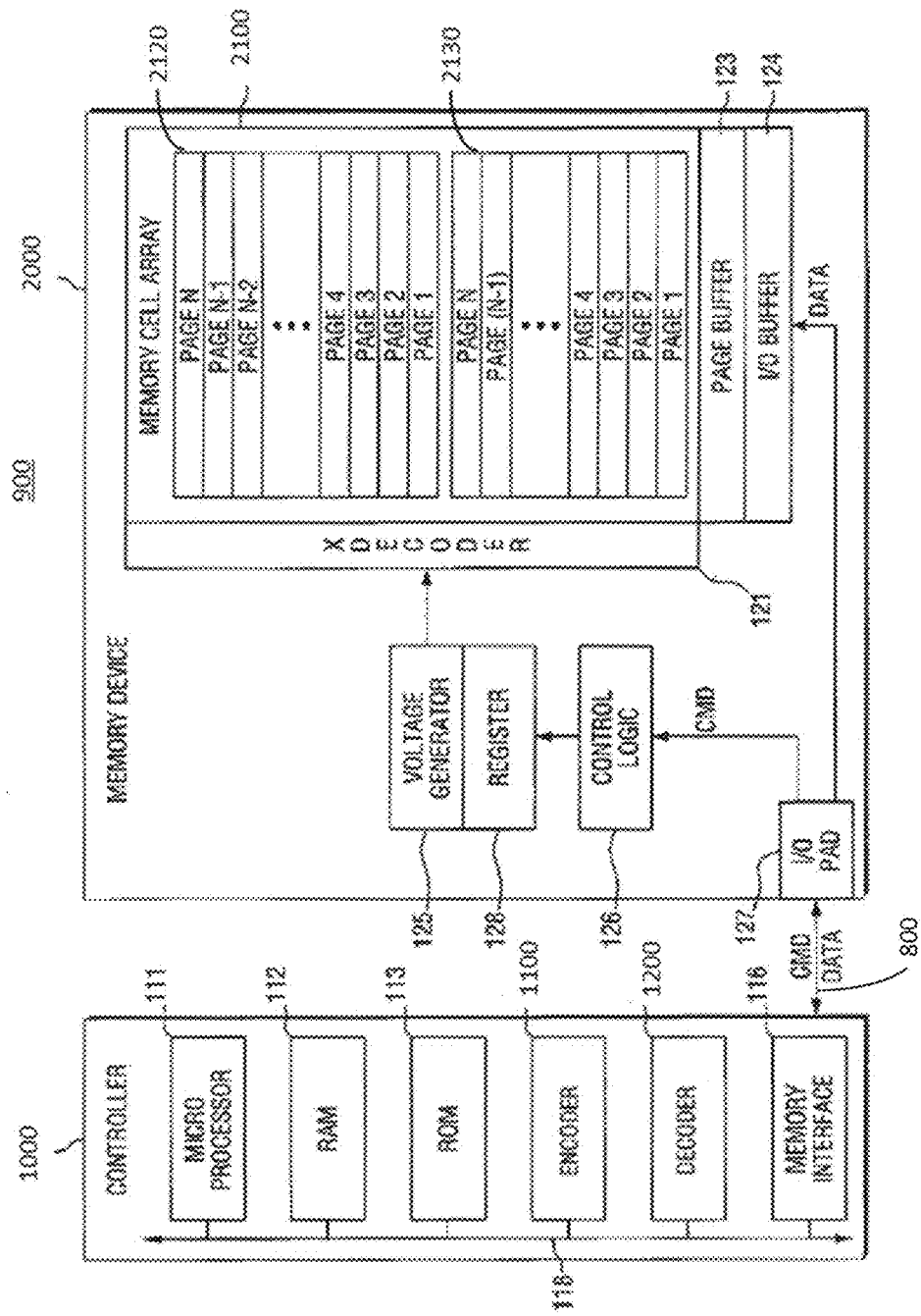
FIG. 1A is a diagram showing a memory system according to at least one example embodiment of the inventive concepts.

Example embodiments will now be described more fully with reference to the accompanying drawings. Many alternate forms may be embodied and example embodiments should not be construed as limited to example embodiments set forth herein. In the drawings, like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., nonvolatile memories universal flash memories, universal flash memory controllers, nonvolatile memories and memory controllers, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying step(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

A code segment may represent a procedure, function, subprogram, program, routine, subroutine, module, software package, class, or any combination of steps, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

I. Overview

The read latency performance advantage flash memory enjoys over some types of magnetic and optical storage is due in part, for example, to random read capabilities of flash memory. However, while 1-bit memory can be read using 1 reference voltage, 2-bit memory may be read using one or more voltages from among 3 different reference voltages, and 3-bit memory may be read using one or more voltages from among 7 different reference voltages. Accordingly, when switching from single level cell (SLC) to multilevel cell (MLC) architectures, read latency may increase due to additional cell reference comparisons.

As used herein the term 2-bit memory cell may be considered synonymous to, and/or referred to as, a 4-level memory cell, and refers to a MLC that stores 2 bits of data by maintaining a value (e.g., threshold voltage) programmed into one of 4 states. As used herein the term 3-bit memory cell may be considered synonymous to, and/or referred to as, a 8-level memory cell, and refers to a MLC that stores 3 bits of data by maintaining a value (e.g., threshold voltage) programmed into one of 8 states.

Accordingly, it would be beneficial to provide a method to reduce read latency. According to at least some example embodiments of the inventive concepts, read latency may be reduced using a read with partial page compression method. The read with partial page compression method may include compressing a partial page that is achieved by a single reference comparison and outputting the partial page in parallel with repeating the process with reading and compressing the partial page associated with another reference comparison. Due to efficient compression, input/output (JO) time duration is reduced. The output data is decompressed at the controller and full page data is restored. Soft information can also be extracted from the decompressed pages and can be used to reduce low density parity check (LDPC) power. Further, because the distribution of '0's and '1's is generally not even (i.e., the distribution is generally not p(1)=(0.5) and p(0)=(0.5) where p(x) represents the ratio of bit value x in given binary data) in data corresponding to a single comparison operation from a data page reading operation including multiple comparison operations using multiple reference voltages, applying compression encoding on data corresponding to such a single comparison operation becomes particularly effective.

Example structures for use with the read with partial page compression method according to at least some example embodiments of the inventive concepts will now be discussed in greater detail below with reference to FIGS. 1A and 1B.

FIG. 1A is a block diagram of a memory system to which a memory according to some embodiments of the present inventive concept is applied. Referring to FIG. 1A, the memory system 900 includes the memory controller 1000 and a nonvolatile memory device 2000.

The nonvolatile memory device 2000 may be, but is not limited to, a flash memory device, a NAND flash memory device, a phase change RAM (PRAM), a ferroelectric RAM (FRAM), a magnetic RAM (MRAM), etc. According to at least one example embodiment of the inventive concepts, the nonvolatile memory device 2000 may include a plurality of NAND flash memory devices. The nonvolatile memory device 2000 may have a planar structure or a three-dimensional (3D) memory cell structure with a stack of memory cells.

The nonvolatile memory device 2000 may include a memory cell array 2100, an X decoder 121, a voltage generator 125, an I/O buffer 124, a page buffer 123, and a control logic 126 each of which may be implemented as one or more circuits. The memory device may also include an input/output (I/O) pad 127.

The memory cell array 2100 includes a plurality of word lines W/L and a plurality of bit lines B/L. Each memory cell may be implemented as a memory cell having a floating gate or a charge storage layer such as a charge trapping layer.

The memory cell array 2100 may include a plurality of blocks and a plurality of pages. One block includes a plurality of pages. A page may be a unit of program and read operations, and a block may be a unit of erase operation. For example, the memory cell array 2100 includes a first block 2120 and a second block 2130. As is illustrated n FIG. 1A, the first block 2120 includes pages 1-N, and the second block 2130 includes pages 1-N, where N is a positive integer greater than 1.

The control logic 126 controls the overall operation of the nonvolatile memory device 2000. When receiving a command CMD from the memory controller 1000, the control logic 126 interprets the command CMD and controls the nonvolatile memory device 2000 to perform an operation (e.g., a program operation, a read operation, a read retry operation, or an erase operation) according to the interpreted command CMD.

According to at least one example embodiment, the control logic 126 may include a hardware-implemented processor configured to execute commands based on command signal CMD. According to at least one example embodiment of the inventive concepts, in addition to the processor, the control logic 126 may also include a storage unit for storing steps that, when executed by the processor included in the control logic 126, cause the processor to perform specific operations. According to at least one example embodiment of the inventive concepts, any operations described herein as being performed by the memory device 2000 may be performed by, or under the control of, the control logic 126, for example, by the processor included in the control logic 126 driving firmware stored in the storage unit included in the control logic 126. Alternatively, the control logic 126 may be a circuit (e.g. an application specific integrated circuit (ASIC)) that is physically programmed, in terms of hardware, to perform or control any operations described herein as being performed by the memory device 2000.

The X decoder 121 is controlled by the control logic 126 and drives at least one of the word lines W/L in the memory cell array 2100 according to a row address.

The voltage generator 125 is controlled by the control logic 126 to generate one or more voltages required for a program operation, a read operation or an erase operation and provide the generated voltages to one or more rows selected by the X decoder 121.

A register 128 is controlled by the control logic 126 and is a space in which information input from the memory controller 1000 is stored and may include a plurality of latches. For example, the register 128 may group read voltage (and/or reference voltage) information and store the information in the form of a table.

The page buffer 123 is controlled by the control logic 126 and operates as a sense amplifier or a write driver according to an operation mode (e.g., a read operation or a program operation).

The I/O pad 127 and the I/O buffer 124 may serve as I/O paths of data exchanged between an external device, e.g., the memory controller 1000 or a host and the nonvolatile memory device 2000. The I/O pad 127 is connected to the controller 1000 through a memory system bus 800. Data and or commands may be output from the memory device 2000 to the controller 1000 or received from the controller 1000 at the memory device 2000 via the I/O pad 127 and the memory system bus 800.

Further, according to at least one example embodiment, the nonvolatile memory device 2000 may include a compression encoder connected in between the page buffer 123 and the I/O buffer 124 as is discussed in greater detail below with reference to FIG. 1B.

Figure 1B:
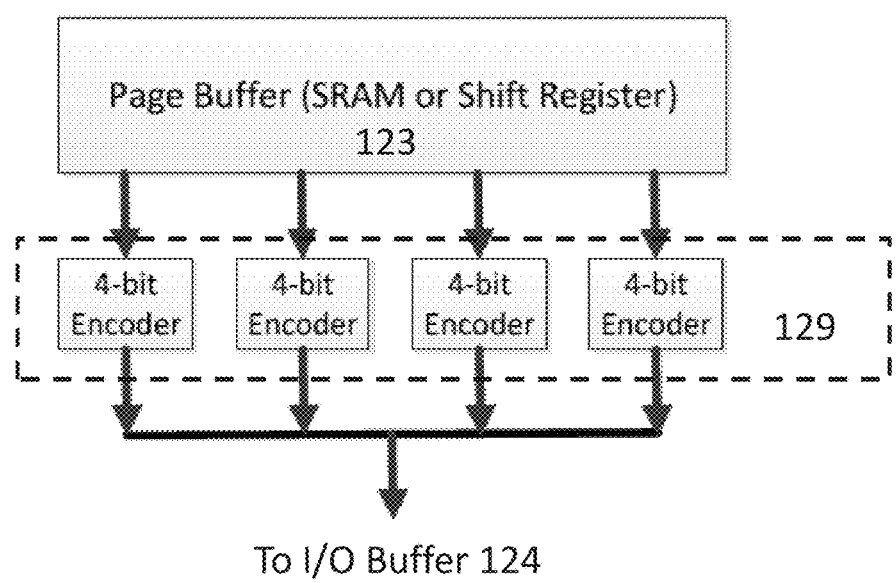
FIG. 1B is a diagram showing an example structure of a Huffman encoder according to at least one example embodiment of the inventive concepts.

FIG. 1B is a diagram showing an example structure of a Huffman encoder according to at least one example embodiment of the inventive concepts.

Referring to FIG. 1B, a compression encoder 129 may be controlled by the control logic 126 to receive bits output from the page buffer 123, compress the received bits, and output the compressed bits to the I/O buffer 124. According to at least one example embodiment of the inventive concepts, the compression encoder 129 is a Huffman encoder that compresses received bits by performing Huffman encoding on the received bits. According to at least one example embodiment, the compression encoder 129 may include four 4-bit encoders that can operate in parallel to encode 16 bits at a time. According to at least one example embodiment, the compression encoder 129 may include any number of encoders each of which encode any number of bits at a time, in accordance with the preferences of a manufacturer or designer of the memory device 2000.

Returning to FIG. 1A, the memory controller 1000 may include a microprocessor 111, a read-only memory (ROM) 113, a random access memory (RAM) 112, an encoder 1100, a decoder 1200, a memory interface 116, and a controller bus 118. The elements 111 through 116 of the memory controller 1000 may be electrically connected to each other through the controller bus 118.

The microprocessor 111 controls the overall operation of the memory system 900 including the memory controller 1000. The microprocessor 111 is a circuit that controls other elements by generating control signals. When power is supplied to the memory system 900, the microprocessor 111 drives firmware (e.g., stored in the ROM 113) for operating the memory system 900 on the RAM 112, thereby controlling the overall operation of the memory system 900. According to at least one example embodiment of the inventive concepts, the microprocessor 111 may also issue steps for controlling operations of other elements of the memory controller 1000 including, for example, some or all of the ROM 113, RAM 112, encoder 1100, decoder 1200, memory interface 116, and controller bus 118. According to at least one example embodiment of the inventive concepts, any operations described herein as being performed by the memory controller 1000 may be performed by, or under the control of, the microprocessor 111, for example, by the microprocessor driving the above-referenced firmware.

While a driving firmware code of the memory system 900 is stored in the ROM 113, one or more example embodiments of the inventive concepts are not limited thereto. The firmware code can also be stored in a portion of the memory system 900 other than the ROM 113. Therefore, the control or intervention of the microprocessor 111 may encompass not only the direct control of the microprocessor 111 but also the intervention of firmware which is software driven by the microprocessor 111.

Alternatively, the microprocessor 111 may be a circuit (e.g. an (ASIC)) that is physically programmed, in terms of hardware, to perform or control any operations described herein as being performed by the memory controller 1000.

The RAM 112, which is a memory serving as a buffer, may store an initial command, data, and various variables input from a host or the microprocessor 111, or data output from the nonvolatile memory device 2000. The RAM 112 may store data and various parameters and variables input to and output from the nonvolatile memory device 2000.

The memory interface 116 may serve as an interface between the memory controller 1000 and the nonvolatile memory device 2000. The memory interface 116 is connected to the I/O pad 127 of the nonvolatile memory device 2000 via the memory system bus 800 and may exchange data with the I/O pad 127 via the memory system bus 800. In addition, the memory interface 116 may create a command suitable for the nonvolatile memory device 2000 and provide the created command to the I/O pad 127 of the nonvolatile memory device 2000. The memory interface 116 provides a command to be executed by the nonvolatile memory device 2000 and an address ADD of the nonvolatile memory device 2000.

According to at least one example embodiment one or both of the microprocessor 111 and the decoder 1200 is capable of performing Huffman decoding to decode Huffman-encoded data.

According to at least one example embodiment of the inventive concepts, the decoder 1200 may be an error correcting code (ECC) decoder, and the encoder 1100 may be an ECC encoder. According to at least one example embodiment of the inventive concepts, the decoder 1200 and the encoder 1100 perform error bit correction. The encoder 1100 may generate data added with one or more parity and/or redundancy bits by performing error correction encoding on data before the data is provided to the nonvolatile memory device 2000. The one or more parity and/or redundancy bits may be stored in the nonvolatile memory device 2000.

The decoder 1200 may perform error correction decoding on output data, determine whether the error correction decoding is successful based on the result of the error correction decoding, and output a step signal based on the determination result. Read data may be transmitted to the decoder 1200, and the decoder 1200 may correct error bits of the data using the one or more parity and/or redundancy bits. When the number of error bits exceeds a limit of error bits that can be corrected, the decoder 1200 cannot correct the error bits, resulting in error correction failure. The encoder 1100 and the decoder 1200 may perform error correction using, for example, one or more of low density parity check (LDPC) code, Bose-Chaudhuri-Hocquenghem (BCH) code, turbo code, Reed-Solomon (RS) code, convolution code, recursive systematic code (RSC), or coded modulation such as trellis-coded modulation (TCM) or block coded modulation (BCM).

Each of the encoder 1100 and the decoder 1200 may include an error correction circuit, system or device.

According to at least one example embodiment, the memory system 900 performs a randomizing function such that the data written to the memory cell array 2100 of the memory device 2000 has a random distribution on 0s and is (i.e., for each bit of write data written to the memory device 2000, a probability that a bit of the data written to the memory device 2000 is '0' equals the probability that the bit of the data written to the memory device 2000 is '1').

According to at least one example embodiment, the controller 1000 performs the randomizing function on data sent to, and received from the memory device 2000. According to at least one example embodiment, the controller 1000 may store instructions (e.g., in the RAM 112 or the ROM 113) that cause the microprocessor 111 to perform the randomizing function. According to at least one example embodiment, the randomizing function includes generating a reference binary vector of length n such that, with respect to each bit in the reference binary vector, a probability that bit is a '0' is equal to a probability that the bit is a '1'.

Further, when the controller 1000 is preparing write data to send to the memory device 2000, the randomizing function includes performing a first exclusive OR (XOR) operation on an initial data vector of length n and the reference vector, and generating, as a randomized write data vector, the result of the first XOR operation. The controller 1000 then sends the randomized write data vector to the memory device 2000 in place of the initial data vector. Further, the memory device 2000 writes the randomized write data vector to memory cell array 2100 as a stored data vector.

Further, the controller 1000 may store the reference vector, for example, in the RAM 112. In addition to, or as an alternative to, storing the reference vector in the RAM 112, the reference vector may be stored in the ROM 113.

Further, when the controller 1000 reads the stored data vector from the memory device 2000, the randomizing function includes restoring the initial data vector by performing a second XOR operation on the read data vector. The result of the second XOR operation is the initial data vector.

While the randomizing function is described above as being performed by controller 1000, alternatively, the randomizing function may be performed in a similar manner by the memory device 2000.

For example, according to at least one example embodiment, the memory device 2000 performs the randomizing function on data sent to, and received from the memory device 2000. According to at least one example embodiment, the memory device 2000 may store instructions that cause the control logic 126 to perform the randomizing function. As is discussed above, the randomizing function includes generating a reference binary vector of length n such that, with respect to each bit in the reference binary vector, a probability that the bit is a '0' is equal to a probability that the bit is a '1'.

Further, when the memory device 2000 is preparing to store an initial data vector of length n received from the controller 1000, the randomizing function includes performing a first XOR operation on the initial data vector and the reference vector, and generating, as a randomized write data vector, the result of the first XOR operation. The memory device 2000 then writes the randomized write data vector to memory cell array 2100 as a stored data vector.

Further, the memory device 2000 may store the reference vector. Further, when the memory device 2000 receives instructions to read the stored data vector, the randomizing function includes restoring the initial data vector by performing a second XOR operation on the stored data vector. The result of the second XOR operation is the initial data vector.

The read with partial page compression method according to at least some example embodiments of the inventive concepts will now be discussed in greater detail below.

II. Explanation of Read with Partial Page Compression

The following notations are used herein to describe the read with partial page compression method according to at least some example embodiments of the inventive concepts.

Notation 1 (Read Reference and Acquired Page): as used herein, the term $Ref_{x,y}$ (or $Ref_{x-y}$, or Refx-y) refers to a reference voltage that is used to distinguish between (i.e., is located in between the voltage levels of) program states Lx and Ly; as used herein, the term $Page_{x,y}$ (or $Page_{x-y}$, or Pagex-y) refers to a page of data obtained by reading a plurality of memory cells using reference voltage $Ref_{x,y}$ (or $Ref_{x-y}$, or Refx-y); and as used herein, a group $\{Ref_{x1,y1}, Ref_{x2,y2}, \ldots, Ref_{xn,yn}\}$ refers to read operation that consists of several reference comparisons.

Notation 2 (Array-to-Page buffer time with single reference): as used herein, the term tREF refers to a length of time of an operation of transferring page data from NAND array to buffer with a single reference; and one example value for tREF, as used herein, is 30 μs.

Notation 3 (Read cycle time): as used herein, the term tRC refers to the length of a read cycle time for outputting a byte to NAND IO; and one example range of values for tRC, as used herein, is 2.5 to 15 nanoseconds (ns).

Notation 4 (Page size): As used herein, the term Pz refers to the number of bytes per page.

FIG. 2 is a figure for explaining a mapping between MLC data values and threshold voltage states according to at least one example embodiment of the inventive concepts.

Item (a) in FIG. 2 is a graph showing a distribution of threshold voltages according to program state for memory cells storing 2-bit data. In item (a) of FIG. 2, the abscissa indicates a threshold voltage and the ordinate indicates the number of memory cells. As is illustrated by item (a) of FIG. 2, a 2-bit memory cell stores data by maintaining a threshold voltage of one of four program states: L0, L1, L2 and L3. In the examples shown in FIG. 2, state L0 corresponds to an erase state. As is illustrated also by item (a) of FIG. 2, data of a 2-bit memory cell may be read using three different reference voltages which are, in order of increasing voltage: $Ref_{0,1}$, $Ref_{1,2}$, and $Ref_{2,3}$.

Item (b) in FIG. 2 is an illustration showing an example mapping between program states L0-L3 and 2-bit data values. In the example shown in item (b) of FIG. 2, program states L0, L1, L2 and L3 correspond to data values '11', '10', '00', and '01', respectively. According to at least one example embodiment of the inventive concepts, Gray codes are used in the mapping between threshold voltage states and data values, such that only one bit changes between data values mapped to adjacent threshold voltage states. The example mapping shown in item (b) of FIG. 2 is a Gray code. In the examples shown in items (a) and (b) of FIG. 2, state L0 corresponds to an erase state.

Item (c) in FIG. 2 is a graph showing a distribution of threshold voltages according to program state for memory cells storing 3-bit data. In item (c) of FIG. 2, the abscissa indicates a threshold voltage and the ordinate indicates the number of memory cells. As is illustrated by item (c) of FIG. 2, a 3-bit memory cell stores data by maintaining a threshold voltage of one of 8 program states: L0, L1, L2, L3, L4, L5, L6, and L7. As is also illustrated by item (c) of FIG. 2, data of a 3-bit memory cell may be read using 7 different reference voltages which are, in order of increasing voltage: $Ref_{0,1}$, $Ref_{1,2}$, $Ref_{2,3}$, $Ref_{3,4}$, $Ref_{4,5}$, and $Ref_{5,6}$, and $Ref_{6,7}$.

Item (d) in FIG. 2 is an illustration showing an example mapping between program states and 3-bit data values. In the example shown in item (d) of FIG. 2, program states L0, L1, L2, L3, L4, L5, L6, and L7 correspond to data values '111', '011', '010', '000', '001', '101', '100', and '110', respectively. The example mapping shown in item (d) of FIG. 2 is also a Gray code. In the examples shown in items (c) and (d) of FIG. 2, state L0 corresponds to an erase state.

Methods and algorithms for performing the read with partial page compression method according to at least some example embodiments of the inventive concepts will now be discussed in greater detail below with reference to FIGS. 3-5C and Algorithms 1 and 2.

MLC read includes several comparisons with reference voltages in order to achieve page data (e.g., most significant bit (MSB), central significant bit (CSB), or least significant bit (LSB) page data). Each sensing with a reference voltage produces a partial page that is merged with a partial page (or partial pages) of consecutive sensing. It may be observed that partial pages contain significant redundancy. Thus, as is discussed in greater detail below with reference to FIG. 3, a partial page produced through sensing using a threshold voltage can be compressed and transmitted to the controller in parallel with the performance of sensing using a next reference voltage. Therefore, as will be discussed in greater detail below with reference to FIG. 3, the amount of IO data output by the memory device 2000, after the last reference voltage comparison is performed, is reduced, and thus, read latency is reduced.

Figure 3:
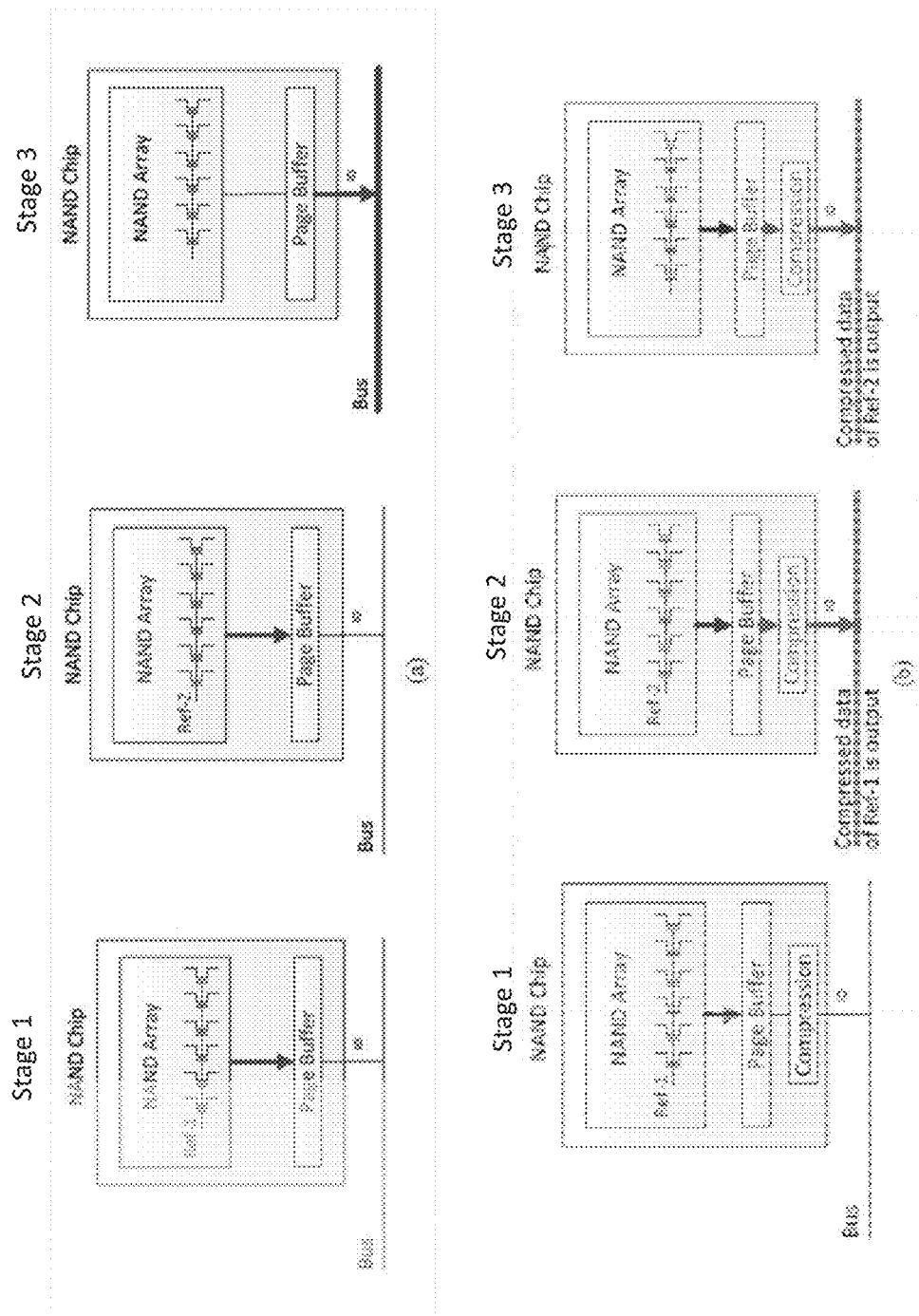
FIG. 3 illustrates a comparison between a conventional method of reading a data page and a read with partial page compression method according to at least one example embodiment of the inventive concepts.

FIG. 3 illustrates a comparison between a conventional method of reading a data page and a read with partial page compression method according to at least one example embodiment of the inventive concepts.

Referring to FIG. 3, item (a) of FIG. 3 illustrates stages in a conventional data page read operation that include two read operations using two reference voltages, respectively; and item (b) of FIG. 3 illustrates stages in a read with partial page compression method according to at least one example embodiment of the inventive concepts.

Referring to item (a) in FIG. 3, in Stage 1 of a conventional reading method, a first partial page is generated by reading data of a plurality of memory cells using a first reference voltage, and the first partial page is stored in a page buffer. In Stage 2 of a conventional reading method, a second partial page is generated by reading data of a plurality of memory cells using a second reference voltage, and the second partial page is stored in a page buffer. In Stage 3 of a conventional reading method, pages 1 and 2 are combined in the page buffer, and the combined page is sent to a host or a controller via a bus.

Referring to item (b) in FIG. 3, in Stage 1 of a read with partial page compression method according to at least some example embodiments, a first partial page is generated by reading data of a plurality of memory cells (e.g., memory cells of memory cell array 2100 illustrated in FIG. 1A) using a first reference voltage, and the first partial page is stored in a page buffer (e.g., the page buffer 123 illustrated in FIG. 1A). In Stage 2 of a read with partial page compression method according to at least some example embodiments, a second partial page is generated by reading data of a plurality of memory cells using a second reference voltage, and the second partial page is stored in a page buffer. Further, in Stage 2 of a read with partial page compression method according to at least some example embodiments, in parallel with the generation and/or storage of the second partial page, the first partial page stored in the page buffer is compressed (e.g., using the compression encoder 129 illustrated in FIG. 1B) to generate a compressed first partial page, and the compressed first partial page is sent to a host or a controller (e.g., the controller 100 illustrated in FIG. 1A) via a bus (e.g., the memory system bus 800 illustrated in FIG. 1A). In Stage 3 of a read with partial page compression method according to at least some example embodiments, the second partial page stored in the page buffer is compressed (e.g., using the compression encoder 129 illustrated in FIG. 1B) to generate a compressed second partial page, and the compressed second partial page is sent to a host or a controller (e.g., the controller 100 illustrated in FIG. 1A) via a bus (e.g., the memory system bus 800 illustrated in FIG. 1A).

A total number of bits included in the compressed second partial page sent to a bus in example (b) illustrated in FIG. 3 may be less than a total number of bits in the combined page sent to a bus in example (a) in FIG. 3. Thus, with respect to example (b) of FIG. 3 in comparison with the conventional example (a) of FIG. 3, the amount of IO output after the last reference comparison is reduced and a read operation is accelerated (i.e., read latency is reduced).

A more detailed example method for reading with partial page compression will now be discussed below with reference to FIGS. 4A, 4B, 4C and 4D.

Figure 4A:
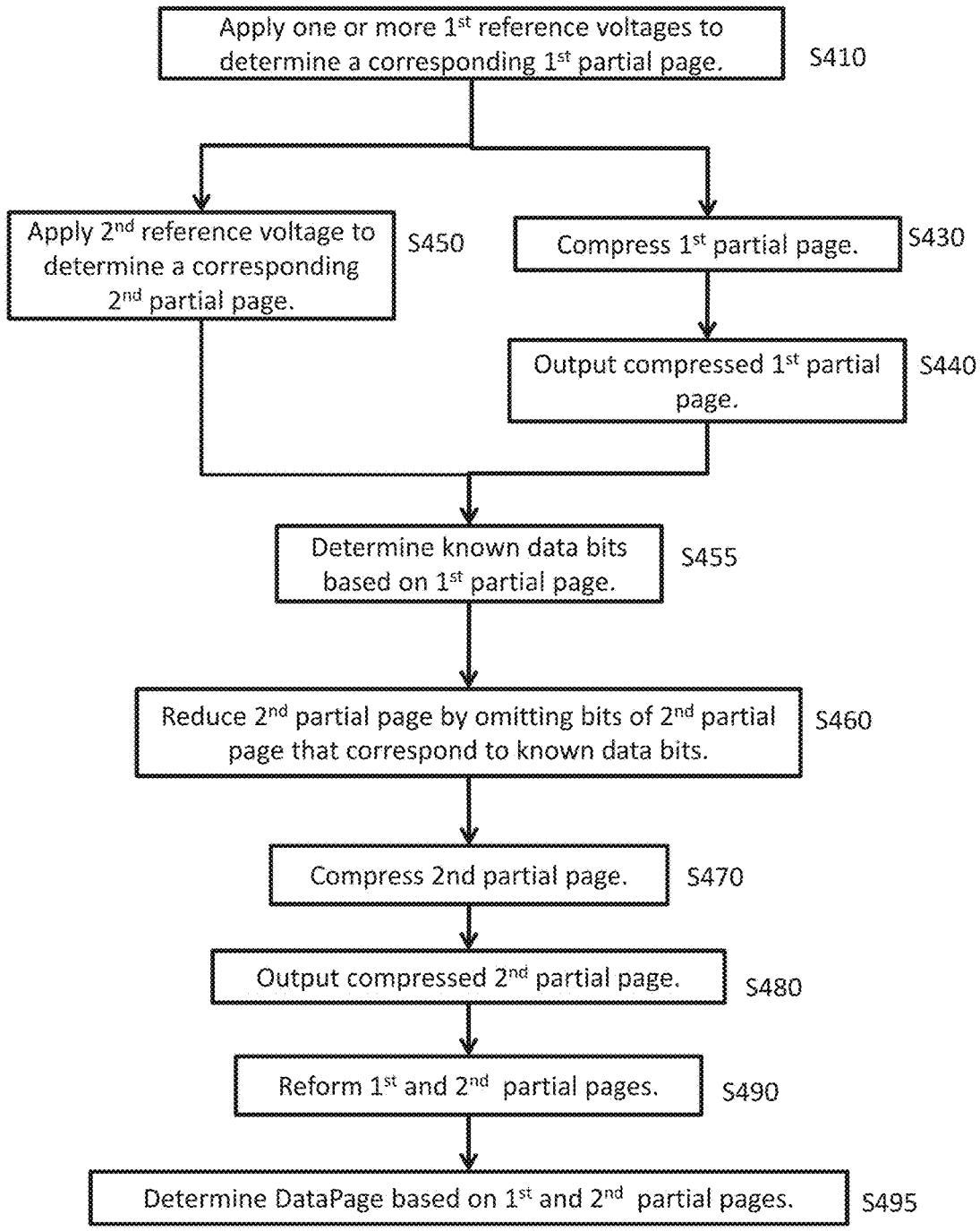
FIG. 4A is a flow chart illustrating a method for reading with partial page compression according to at least one example embodiment of the inventive concepts.
Figure 4C:
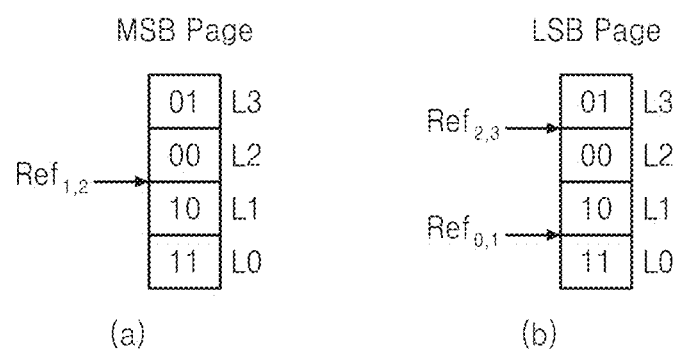
FIG. 4C is a diagram for explaining most significant bit (MSB) and least significant bit (LSB) data page reading operations for memory cells storing 2-bit data.

FIG. 4A is a flow chart illustrating a method for reading with partial page compression according to at least one example embodiment of the inventive concepts. FIG. 4B illustrates the contents of five example memory cells 40 of the memory cell array 2100. FIG. 4C is a diagram for explaining MSB and LSB data page reading operations for memory cells storing 2-bit data. FIG. 4D is a diagram for explaining the formation of partial pages in a read operation involving 4-level MLCs according to at least one example embodiment of the inventive concepts.

As is illustrated in FIG. 4B, example memory cells 40 include 5 cells, first example memory cell 41 storing data '00', second example memory cell 43 storing data '00', third example memory cell 45 storing data '10', fourth example memory cell 47 storing data '11', and fifth example memory cell 49 storing data '01'. Memory cells 40 may be, for example, five 4-level cells of Page 1 of first block 2120 of memory cell array 2100 illustrated in FIG. 1A. According to at least one example embodiment of the inventive concepts, memory cells 40 are located on the same word line as each other, from among the word lines of memory cell array 2100.

The data values illustrated in items (a) and (b) of FIG. 4C follow the same mapping of threshold voltage states to data values shown in item (b) of FIG. 2. As is illustrated in FIG. 4C, when a mapping of threshold voltage states to data values shown in item (b) of FIG. 2 is used, the memory device 2000 can read an MSB page of 2-bit memory cells with one comparison (i.e., read) operation based using the reference voltage $Ref_{1,2}$, and the memory device 2000 can read an LSB page of 2-bit memory cells with two comparison (i.e., read) operations using the reference voltages $Ref_{0,1}$ and $Ref_{2,3}$.

As used herein, the term data page refers to a MSB page, LSB page or CSB page. As used herein, the term MSB page or MSB data page refers to a page composed of the MSBs of a plurality of MLCs being read. As used herein, the term LSB page or LSB data page refers to a page composed of the LSBs of a plurality of MLCs being read. As used herein, the term CSB page or CSB data page refers to a page composed of the CSBs of a plurality of MLCs being read. As used herein, the term partial page or temporary page refers to a page that is composed of bits representing the result of an intermediate comparison operation performed by comparing threshold voltages of a plurality of MLCs to a reference voltage, where an intermediate comparison operation is one of multiple comparison operations performed in order to determine a data page. For example, the term partial page (or temporary page) refers to a page that is combined with other partial pages (or temporary pages) in order to determine a data page. A page that is not a data page, but is formed from a combination of partial pages (or temporary pages), is also referred to herein as a partial page (or temporary page).

FIG. 4A will be explained with reference to an example where an LSB page of the example memory cells 40 is read assuming a mapping of threshold voltage states to data values shown in FIG. 4C. Further, FIG. 4A will be explained with reference to an example where the following partial page mapping is used: a partial page $Page_{0,1}$ is generated by assigning a bit value of '1' to cells with threshold values below $Ref_{0,1}$ and assigning a bit value of '0' to cells with threshold values above $Ref_{0,1}$; and a partial page $Page_{2,3}$ is generated by assigning a bit value of '1' to cells with threshold values above $Ref_{2,3}$ and assigning a bit value of '0' to cells with threshold values below $Ref_{2,3}$.

Referring to FIG. 4A, in step S410, the memory device 2000 applies one or more $1^{st}$ reference voltages to determine a $1^{st}$ corresponding partial page. For example, in step S410 the memory device 2000 generates comparison results by performing a comparison of the threshold voltages of the memory cells 40 to the reference voltage $Ref_{0,1}$ and generates partial page $Page_{0,1}$ including bits "00010" as is shown in FIG. 4D. Specifically, only one of memory cells 40 (fourth memory cell 47) stores data corresponding to a threshold voltage below reference voltage $Ref_{0,1}$. Accordingly, bits of partial page $Page_{0,1}$ corresponding to all of memory cells 40 except fourth memory cell 47 are '0', and the bit of partial page $Page_{0,1}$ corresponding to fourth memory cell 47 is '1'. In step S410, after generating partial page $Page_{0,1}$, the memory device 2000 may store partial page $Page_{0,1}$, for example, in page buffer 123.

In step S430, the memory device 2000 compresses the $1^{st}$ partial page. For example, in step S430, the memory device 2000 (e.g., the control logic 126) may control the page buffer 123 to output $Page_{0,1}$ to the compression encoder 129, and control the compression encoder 129 to compress partial page $Page_{0,1}$ using, for example, Huffman encoding, thereby generating a compressed partial page $CPage_{0,1}$. The memory device 2000 (e.g., the control logic 126) may also control the compression encoder 129 to output the compressed partial page $CPage_{0,1}$ to the I/O buffer 124.

In step S440, the memory device 2000 outputs the compressed $1^{st}$ partial page. For example, in step S440, the memory device 2000 (e.g., the control logic 126) controls the I/O buffer 124 to output the compressed partial page $CPage_{0,1}$ to the controller 1000 via the I/O pad 127 and the memory system bus 800, and the controller 1000 (or a host) receives and stores the compressed partial page $CPage_{0,1}$ (e.g., in the RAM 112).

In step S450, the memory device 2000 applies a $2^{nd}$ reference voltage to determine a $2^{nd}$ corresponding partial page. For example, in step S450 the memory device 2000 generates comparison results by performing a comparison of the threshold voltages of the memory cells 40 to the reference voltage $Ref_{2,3}$ and generates partial page $Page_{2,3}$ including bits "00001" as is shown in FIG. 4D. Specifically, only one of memory cells 40 (fifth memory cell 49) stores data corresponding to a threshold voltage above reference voltage $Ref_{2,3}$. Accordingly, bits of partial page $Page_{2,3}$ corresponding to all of memory cells 40 except fifth memory cell 49 are '0', and the bit of partial page $Page_{2,3}$ corresponding to the fifth memory cell 49 is '1'.

According to at least one example embodiment, as is shown in FIG. 4A, step S450 may be performed by the memory device 2000 in parallel with the performance of one or both of steps S430 and S440. Alternatively, step S450 may be performed by the memory device 2000 after the performance of one or both of steps S430 and S440, or step S450 may be performed by the memory device 2000 before the performance of one or both of steps S430 and S440.

In Step S455, the memory device 2000 determines known data bits based on the $1^{st}$ partial page. As used herein, known data bits are data bits (e.g., bits of an LSB, MSB or CSB page) that are known before all of a plurality of comparison operations associated with reading an LSB, MSB or CSB page are completed. For example, referring to item (b) of FIG. 4C, any memory cells that are determined to be below reference voltage $Ref_{0,1}$ are known to have an LSB of '1', even before a second comparison operation is performed using reference voltage $Ref_{2,3}$. Specifically, after step S410, the memory device 2000 knows the LSB of fourth memory cell 47 is '1', because no other value is possible based on the mapping shown in item (b) of FIG. 4C. Accordingly, in step S455, the memory device 2000 determines that the LSB '1' of the fourth memory cell 47 is a known bit.

In step S460, the memory device 2000 reduces the $2^{nd}$ partial page by omitting bits of the $2^{nd}$ partial page that correspond to known data bits. For example, as is discussed above, in step S455, the memory device 2000 determined that the LSB of the fourth memory cell 47 is a known data bit having the value '1'. Accordingly, the memory device 2000 may generate reduced partial page RPage$_{2,3}$ including bits "0001", as illustrated in FIG. 4D, by omitting the bit of partial page Page$_{2,3}$ that corresponds to the fourth memory cell 47 (i.e., the fourth bit of partial page Page$_{2,3}$). The omitted bit is illustrated with a bold X in FIG. 4D. As is illustrated in FIG. 4D, reduced partial page RPage$_{2,3}$ has fewer bits (i.e., 4 bits) than partial page Page$_{2,3}$ (i.e., 5 bits). The memory device 2000 (e.g., the control logic 126) may control the page buffer 123 to store reduced partial page RPage$_{2,3}$.

In step S470, the memory device 2000 compresses $2^{nd}$ partial page. For example, in step S470, the memory device 2000 (e.g., the control logic 126) may control the page buffer 123 to output reduced partial page RPage$_{2,3}$ to the compression encoder 129, and control the compression encoder 129 to compress reduced partial page RPage$_{2,3}$ using, for example, Huffman encoding, thereby generating a compressed reduced partial page CRPage$_{2,3}$. The memory device 2000 (e.g., the control logic 126) may also control the compression encoder 129 to output the compressed reduced partial page CRPage$_{2,3}$ to the I/O buffer 124.

In step S480, the memory device 2000 outputs the compressed $2^{nd}$ partial page. For example, in step S480, the memory device 2000 (e.g., the control logic 126) controls the I/O buffer 124 to output the compressed reduced partial page CRPage$_{2,3}$ to the controller 1000 (or a host) via the I/O pad 127 and the memory system bus 800 and the controller 1000 (or a host) receives and stores the compressed reduced partial page CRPage$_{2,3}$ (e.g., in the RAM 112).

In step S490, the controller 1000 (or a host) re-forms the $1^{st}$ and $2^{nd}$ partial pages. In step S490, the controller 1000 (e.g., the microprocessor 111 and/or the decoder 1200) may decompress the compressed partial page CPage$_{0,1}$ using, for example, Huffman decoding, to reform the partial page Page$_{0,1}$ which includes bits "00010" as shown in FIG. 4D. Further, the controller 1000 may be aware of the mapping between threshold voltage state and data value used to store data in memory cells 40. Accordingly, the controller 1000 may determine that LSB bits of memory cells corresponding to '1' bits in the partial page Page$_{0,1}$ are known to be '1'.

Further, in step S490, the controller 1000 (e.g., the microprocessor 111 and/or the decoder 1200) may decompress the compressed reduced partial page CRPage$_{2,3}$ using, for example, Huffman decoding, to reform the reduced partial page RPage$_{2,3}$, which includes bits "0001" as shown in FIG. 4D. Further, based on the earlier determination of the controller 1000 that the LSB bit of the fourth memory cell is a known bit, the controller 1000 may add a bit that corresponds to the known bit to the reduced partial page RPage$_{2,3}$. For example, the controller 1000 may reform partial page Page$_{2,3}$ by adding a '0' in the 4th bit position of the reduced partial page RPage$_{2,3}$ to reform the partial page Page$_{2,3}$, which includes bits "00001" as shown in FIG. 4D.

In step S495, the controller 1000 (e.g., the microprocessor 111) determines a page DataPage of the memory cells 40 based on the $1^{st}$ and $2^{nd}$ partial pages. For example, in step S495, the controller 1000 may determine, as the page DataPage, the LSB page of memory cells 40 by performing one or more arithmetic operations on partial page Page$_{0,1}$ and partial page Page$_{2,3}$. For example, the memory controller 1000 may perform a bitwise OR operation on Page$_{0,1}$ (i.e., "00010") and Page$_{2,3}$ (i.e., "00001") to determine that page DataPage (i.e., the LSB page of memory cells 40) is: "00011".

As an alternative to adding a '0' to RPage$_{2,3}$ to reform the partial page Page$_{2,3}$ in step S490, the memory controller can simply perform a bitwise OR operation on Page$_{0,1}$ (i.e., "00010") and RPage$_{2,3}$ (i.e., "0001") by skipping the OR operation for 4th bit position (and still performing the bitwise OR operation for the 5th bit position), because LSB data for the 4th bit position is already known to be '1', thus determining that the LSB page of memory cells 40 is: "00011".

Thus, the method illustrated in FIG. 4A may result in the amount of IO data output by the memory device 2000 after a last reference comparison (i.e., step S450) being reduced, thereby accelerating a read operation (i.e., reducing read latency) in comparison to a conventional MLC read method.

Though the read with partial page compression method illustrated in FIG. 4A is explained with reference to an example where an LSB page is read from 4-level (i.e., 2-bit) MLC memory cells, according to at least one example embodiment of the inventive concepts the method illustrated in FIG. 4A may also be applied to reading an MSB page of 4-level memory cells in situations where two reference voltages are used to read the MSB page. Further, according to at least one example embodiment of the inventive concepts the method illustrated in FIG. 4A may also be applied to reading MSB, CSB, or LSB data pages of memory cells other than 4-level memory cells (e.g., 8-level memory cells) as will be discussed in greater detail below with reference to Algorithm 2 and FIGS. 5A-5C.

Though the method illustrated in FIG. 4A is explained with reference to an example where a threshold voltage state to data value mapping illustrated in FIG. 4C (which is the same as that illustrated in item (b) of FIG. 2) is used, according to at least one example embodiment of the inventive concepts, the method illustrated in FIG. 4A may be performed for any threshold voltage state to data value mapping that satisfies the constraints of Gray codes.

The method illustrated in FIG. 4A is explained above with reference to an example where the following partial page mapping is used: Page$_{0,1}$ is generated by assigning a bit value of '1' to cells with threshold values below Ref$_{0,1}$ and assigning a bit value of '0' to cells with threshold values above Ref$_{0,1}$; and a partial page Page$_{2,3}$ is generated by assigning a bit value of '1' to cells with threshold values above Ref$_{2,3}$ and assigning a bit value of '0' to cells with threshold values below Ref$_{2,3}$. However, according to at least one example embodiment of the inventive concepts, any partial page mapping may be used. For example, any partial page mapping that allows the memory device 2000 to identify known data bits in step S460 may be used with the method of FIG. 4A, according to at least one example embodiment of the inventive concepts.

Though the method illustrated in FIG. 4A is explained with reference to an example where all of steps S430, S455 S460, and S470 are performed, as an alternative, according to at least one example embodiment, step S455 and S460 may be omitted. Accordingly, in step S470, instead of generating the compressed reduced partial page CRPage$_{2,3}$ by compressing reduced partial page RPage$_{2,3}$, the memory device 200 may compress the full partial page Page$_{2,3}$ thereby generating compressed partial page CPage$_{2,3}$. Accordingly, the page output to the controller 1000 in step S480 would be the compressed partial page CPage$_{2,3}$, and reforming the $2^{nd}$ partial page in step S490 would include performing a Huffman decoding operation on compressed partial page CPage$_{2,3}$ to generate partial page Page$_{2,3}$. As a result of the compression of one or both of partial pages Page$_{0,1}$ and Page$_{2,3}$, an amount IO data output by the memory device 2000 after a second read operation (i.e. step S450) may still be reduced thereby accelerating read latency in comparison to a conventional MLC read method.

As another alternative, according to at least one example embodiment, step S455 and S460 may be retained while one or both of steps S430 and S470 are omitted. Accordingly, in step S440 the uncompressed partial page $Page_{1,0}$ may be output to the controller 1000 and/or in step S470 the uncompressed reduced partial page $RPage_{2,3}$ may be output to the controller 1000. As a result of the reduction of one partial page $Page_{2,3}$ in step S460, an amount IO data output by the memory device 2000 after a second read operation (i.e. step S450) may still be reduced thereby accelerating read latency in comparison to a conventional MLC read method.

A method of reading a data page using a partial page compression method according to at least one example embodiment of the inventive concepts, as applied to 2-bit cells, will now be discussed in additional detail with reference to Algorithm 1 below, which is expressed in pseudocode.

---

Algorithm 1: Partial-Page Compression, 4-levels (2 bits) MLC

---

(F1) $Page_{0,1}$ ← Read raw data with $\{Ref_{0,1}\}$
(F2) $CPage_{0,1}$ ← Compress $Page_{0,1}$
(F3) Output $CPage_{0,1}$ to controller in parallel with next sensing:
$Page_{2,3}$ ← Read raw data with $\{Ref_{2,3}\}$
(F4) $RPage_{2,3}$ ← $Page_{2,3}$ bits reduced by removing '0' bits that correspond to a memory cell for which a value '1' exists in $Page_{0,1}$
(F5) $CRPage_{2,3}$ ← Compress Part2Reduced
(F6) Output $CRPage_{2,3}$ to controller
(F7) Decompress $CPage_{0,1}$ and $CRPage_{2,3}$ to generate $Page_{0,1}$ and $RPage_{2,3}$, respectively, at the controller; and
build data page with structure DataPage ← {all zeros}:
A. Bitwise OR between Part1 and DataPage; and
B. Bitwise OR between Part2Reduced and DataPage indices with value '0'
end

---

According to at least one example embodiment of the inventive concepts, Steps (F1) and (F2) in Algorithm 1 correspond to steps S410 and S430, respectively, in FIG. 4A; step (F3) in Algorithm 1 corresponds to steps S440 and S450 in FIG. 4A; step (F4) in Algorithm 1 corresponds to steps S455 and S460 in FIG. 4A; steps (F5) and (F6) in Algorithm 1 correspond to steps S470 and S480, respectively, in FIG. 4A; and step (F7) in Algorithm 1 corresponds to steps S490 and S495 in FIG. 4A.

Consider for example 4-level (i.e., 2-bit) memory cells located on the same word line and storing data in accordance with threshold voltage state to data value mapping illustrated in item (b) of FIG. 2, where Pz=(8K+1K), and reading a first MLC page of the 4-level cells is accomplished using reference voltages $\{Ref0-1, Ref2-3\}$. The read latency associated with reading the first MLC page is 2tREF+9KtRC. In partial page compression, after tREF, partial page $Page_{0,1}$, which has been transferred from the memory cells to a buffer, is compressed. Since page bits are distributed with p(1)=0.25 and p(0)=0.75, H(p) is ~0.8, where p(x) represents a probability of a value x, and H(p) is a binary entropy function defined by Equation (1) below:

$$H(p) = \sum_{p} p_i \log p_i. \quad (1)$$

The first MLC page can be compressed to ~6 kilobytes (KB) and transmitted to controller 1000 in parallel with performing sensing with reference voltage $Ref_{2,3}$. As is discussed above, the partial page $Page_{2,3}$ is reduced such that all '0' bits of the partial page $Page_{2,3}$ located at a position for which a corresponding bit in $Page_{0,1}$ is '1' are dropped. The dropped bits can be ignored since the places of '1' in $Page_{0,1}$ are known bits that were already transmitted. The resulting reduction is a 25% reduction to 0.75 of the page size (i.e., because 25% of 1's were already transmitted). The remaining data (i.e., data of the reduced page $RPage_{2,3}$) is distributed with p(1)=0.33 and p(0)=0.66, where H(p)=−⅓ log₂⅓− ⅔ log₂⅔=0.9091. The new latency is 2tREF+5.4KtRC.

Further, it should be noted that the remaining MLC page of the 4-level cells is read with a single reference voltage $\{Ref1-2\}$, and may be read in a conventional manner, because Algorithm 1 applies to read operations that include multiple reference comparisons.

In 4-level MLCs, page read acceleration (i.e., read latency reduction) with $\{Ref0-1, Ref2-3\}$ is expressed by Equation (2):

$$Read_{Acceleration} = \frac{2t_{REF} + P_Z t_{RC}}{2t_{REF} + R \cdot H(p) P_Z t_{RC}}, \quad (2)$$

where R denotes the reduction percentage in last page size transmission due to known previously sensed data (indexes of '1' were already output and therefore last page runs over '0' indexes and mark the '1's according to a last partial page).

The value R is defined by Equations (3) below:

$$R = 1 - \sum_{\substack{P_R \in \{transmitted\ pages \\ without\ last\ one\}}} \frac{W(P_R)}{P_Z}. \quad (3)$$

Accordingly, the value $$R\ is = 1 - \frac{0.25 P_Z}{P_Z} = 0.75.$$

The size of R is determined by $W(P_R)$—the hamming weight (i.e., number of '1's) of one or more previous pages that were sensed (in this case $Page_{0,1}$) divided by page size.

A method of reading a data page using a partial page compression method according to at least one example embodiment of the inventive concepts, as applied to 3-bit cells, will now be discussed below with reference to FIGS. 5A, 5B, 5C and Algorithm 2.

FIG. 5A illustrates the contents of example memory cells of the memory cell array illustrated in FIG. 1A. FIG. 5B is a diagram for explaining MSB, CSB, and LSB data page reading operations for memory cells storing 3-bit data. FIG. 5C is a diagram for explaining the formation of partial pages in a read operation involving 8-level cells according to at least one example embodiment of the inventive concepts.

As is illustrated in FIG. 5A, example memory cells 50 include 5 cells, first example memory cell 51 storing data '110', second example memory cell 53 storing data '111', third example memory cell 55 storing data '101', fourth example memory cell 57 storing data '100', and fifth example memory cell 59 storing data '000'. Memory cells 50 may be, for example, five 8-level cells of Page 1 of first block 2120 of memory cell array 2100 illustrated in FIG. 1A. According to at least one example embodiment of the inventive concepts, memory cells 50 are located on the same word line as each other, from among the word lines of memory cell array 2100.

The data values illustrated in items (a)-(c) of FIG. 5B follow the same mapping of threshold voltage states to data values shown in item (d) of FIG. 2. As is illustrated in FIG. 5B, when a mapping of threshold voltage states to data values shown in item (d) of FIG. 2 is used, the memory device 2000 can read an MSB page of 3-bit memory cells with two comparison (i.e., read) operations using the reference voltages $Ref_{4,5}$ and $Ref_{0,1}$; the memory device 2000 can read a CSB page of 3-bit memory cells with two comparison (i.e., read) operations using the reference voltages $Ref_{2,3}$ and $Ref_{6,7}$; and the memory device 2000 can read a LSB page of 3-bit memory cells with three comparison (i.e., read) operations using the reference voltages $Ref_{5,6}$, $Ref_{3,4}$, and $Ref_{1,2}$.

Algorithm 2 illustrates a method of reading a data page using a partial page compression method according to at least one example embodiment of the inventive concepts, as applied to 3-bit cells, and is expressed in pseudo code below.

---

Algorithm 2: Partial-Page Compression, 8-levels MLC

---

(E1) If page is read with {Ref0-1, Ref4-5} or {Ref2-3, Ref6-7}
then execute 4-levels algorithm (i.e., Algorithm 1) with given Refs
else
(E2) $Page_{3,4}$ ← Read raw data with {Ref3-4}
(E3) $Page_{5,6}$ ← Read raw data with {Ref5-6}
(E4) Sensing of $Page_{1,2}$ ← Read raw data with {Ref1-2}
in parallel with:
Part1and2 ← bitwise AND between $Page_{3,4}$ and $Page_{5,6}$;
CPart1and2 ← compress Part1and2; and
Output CPart1and2 to controller
(E5) $RPage_{1,2}$ ← $Page_{1,2}$ bits reduced by removing '0' bits that correspond to a memory cell for which a value '1' exists in Part1and2
(E6) $CRPage_{1,2}$ ← Compress $RPage_{1,2}$
(E7) Output $CRPage_{1,2}$ to controller
(E8) Decompress CPart1and2 and $CRPage_{1,2}$ to generate Part1and2 and $RPage_{1,2}$, respectively, at the controller; and
build data page with structure DataPage ← {all zeros}:
A. Bitwise OR between Part1and2 and DataPage; and
B. Bitwise OR between $RPage_{1,2}$ and DataPage indices with value '0'.

---

While FIG. 4A is described above with reference to an example where a data page of 4-level cells is being read, the method illustrated in FIG. 4A may also be performed for memory cells having more than 4 levels including, for example 8-level cells. For example, according to at least one example embodiment of the inventive concepts, step (E1) in Algorithm 2 corresponds to the completion of all of steps S410 to S495 in FIG. 4A; steps (E2) and (E3) in Algorithm 2 correspond to step S410 in FIG. 4A; step (E4) in Algorithm 2 corresponds to steps S430, S440 and S450 in FIG. 4A; step (E5) in Algorithm 2 corresponds to steps S455 and S460 in FIG. 4A; steps (E6) and (E7) in Algorithm 2 correspond to steps S470 and S480, respectively, in FIG. 4A; and step (E8) in Algorithm 2 corresponds to steps S490 and S495 in FIG. 4A.

Algorithm 2 will now be discussed in greater detail below with reference to an example where an LSB page of memory cells 50 is read, and where the following partial page mapping is used: a partial page $Page_{3,4}$ is generated by assigning a bit value of '1' to cells with threshold values above $Ref_{3,4}$ and assigning a bit value of '0' to cells with threshold values below $Ref_{3,4}$; a partial page $Page_{5,6}$ is generated by assigning a bit value of '0' to cells with threshold values above $Ref_{5,6}$ and assigning a bit value of '1' to cells with threshold values below $Ref_{5,6}$; and a partial page $Page_{1,2}$ is generated by assigning a bit value of '0' to cells with threshold values above $Ref_{1,2}$ and assigning a bit value of '1' to cells with threshold values below $Ref_{1,2}$.

Referring to Algorithm 2, in step (E1) the memory system 2000 determines which reference voltages are to be used for the data page being read. If the memory system 2000 determines that only two reference voltages are to be used (e.g., the data page being read is the MSB page or CSB page illustrated in FIG. 5B), the memory system 200 performs Algorithm 1 using the two reference voltages needed to read the data page in place of reference voltages $Ref_{0,1}$ and $Ref_{2,3}$ discussed above with respect to Algorithm 1.

If the memory system 2000 determines that three reference voltages are to be used (e.g., the data page being read is the LSB page illustrated in FIG. 5B), the memory device 2000 proceeds to steps (E2) and (E3). In step (E2), the memory device 2000 generates partial page $Page_{3,4}$ by comparing the threshold voltages of memory cells 50 to the reference voltage $Ref_{3,4}$. In step (E3), the memory device 2000 generates partial page $Page_{5,6}$ by comparing the threshold voltages of memory cells 50 to the reference voltage $Ref_{5,6}$. As illustrated in FIG. 5C, $Page_{3,4}$ is "10110" and $Page_{5,6}$ is "01101".

In step (E4), the memory device 2000 generates partial page $Page_{1,2}$ by comparing the threshold voltages of memory cells 50 to the reference voltage $Ref_{1,2}$. As illustrated in FIG. 5C, $Page_{1,2}$ is "01000". In parallel with the generation of $Page_{1,2}$, the memory controller 2000 generates combined partial page Part1and2 by performing a bitwise AND operation on partial pages $Page_{3,4}$ and $Page_{5,6}$; the memory controller 2000 generates compressed combined partial page CPart1and2 by compressing Part1and2 (e.g., by applying Huffman encoding using the compression encoder 129); and the memory controller 2000 outputs compressed combined partial page CPart1and2 to the controller. For example, the memory controller 2000 outputs the compressed combined partial page CPart1and2 to the controller 1000 using the memory system bus 800, and the controller 1000 receives and stores the compressed combined partial page CPart1and2 (e.g., in the RAM 112). As is illustrated in FIG. 5C, combined partial page Part1and2 is "00100".

In step (E5), the memory device 2000 generates reduced partial page $RPage_{1,2}$ by removing '0' bits that correspond to a memory cell for which a value '1' exists in Part1and2. For example, the memory device 2000 may determine that bits of combined partial page Part1and2 having a value '1' correspond to memory cells having an LSB page value of '1', even without comparing combined partial page Part1and2 to $Page_{1,2}$. Accordingly, the memory device 2000 may determine the LSB page bit corresponding to the third memory cell, memory cell 55, to be a known data bit. Thus, step (E5) includes the memory controller 2000 omitting the third bit of partial page $Page_{1,2}$ to generate reduced partial page $RPage_{1,2}$, having the value 0100 as is illustrated in FIG. 5C. The omitted bit is illustrated with a bold X in FIG. 5C.

In step (E6), the memory device 2000 compresses reduced partial page $RPage_{1,2}$ (e.g., by performing Huffman encoding using the compression encoder 129) to generate compressed reduced partial page $CRPage_{1,2}$.

In step (E7), the memory device outputs compressed reduced partial page $CRPage_{1,2}$ to the controller. For example, the memory device 2000 outputs compressed reduced partial page $CRPage_{1,2}$ to the controller 1000 via the memory system bus 800, and the controller 1000 receives and stores the compressed reduced partial page $CRPage_{1,2}$ (e.g., in the RAM 112).

In step (E8), the controller 1000 (e.g., the microprocessor 111 and/or the decoder 1200) decompresses the compressed combined partial page CPart1and2 using, for example, Huffman decoding, to reform combined partial page Part1and2 which includes bits "00100" as shown in FIG. 5C. Further, the controller 1000 may be aware of the mapping between threshold voltage state and data value used to store data in memory cells 40. Accordingly, the controller 1000 may determine that LSB bits of memory cells corresponding to '1' bits in the combined partial page Part1and2 are known to be '1'. Further, the controller 1000 (e.g., the microprocessor 111 and/or the decoder 1200) may decompress the compressed reduced partial page CRPage$_{1,2}$ using, for example, Huffman decoding, to reform the reduced partial page RPage$_{1,2}$, which includes bits "0100" as shown in FIG. 5C. Further, the controller 1000 may form a page DataPage by performing a bitwise OR operation between combined partial page Part1and2 (having the value "00100") and the bits of reduced partial page RPage$_{1,2}$ (having the value 0100), for example by skipping the omitted third bit of reduced partial page RPage$_{1,2}$ and replacing the omitted third bit with the known LSB bit '1' in the output, to generate page DataPage (i.e., the LSB page of memory cells 50) as "01100".

In 8-level MLCs with partial page compression, random read latency is reduced by $$\frac{2t_{REF} + P_Z t_{RC}}{2t_{REF} + 0.45 P_Z t_{RC}}$$

for two of the pages (i.e., pages read with two reference voltages), and by $$\frac{3t_{REF} + P_Z t_{RC}}{3t_{REF} + 0.68 P_Z t_{RC}}$$

for the third page (i.e., page read with three reference voltages).

For example, FIGS. 2 and 5B show a mapping of data bits to an 8-level MLC. Item (a) in FIG. 5B shows the reference voltages associated with an MSB page read operation. Sensing with reference voltage Ref$_{4,5}$ results in partial page Page$_{4,5}$ having a size Pz=8K+1K and having 37.5% 1's and 62.5% 0's due to the uniform distribution of 0's and 1's in the data written to the memory cell array 2100 of the memory device 2000 resulting from use of a randomizer, as is discussed above with reference to FIG. 1A. The entropy H(p) is 0.95. After first sensing with reference voltage Ref$_{4,5}$, array cells are compared with reference voltage Ref$_{0,1}$ in parallel with the output of the previous partial page Page$_{4,5}$. The data sensed using reference voltage Ref$_{0,1}$ (e.g., Page$_{0,1}$) is reduced such that indices of Page$_{0,1}$ that correspond to 1's in the previous partial page Page$_{4,5}$ are ignored. After reduction, Page$_{4,5}$ is compressed with p(1)=0.2, p(0)=0.8 and H(p)=0.72. After the second sensing is done, the memory device 2000 outputs a page having a size that is 0.72×0.625=0.45 (i.e. 45%) of a full page size, and therefore a read operation is accelerated by $$\frac{2t_B + P_Z t_{RC}}{2t_B + 0.45 P_Z t_{RC}}.$$

The same result holds also for the CSB page. Reading of the LSB page is discussed in detail above with reference to Algorithm 2. Combined partial page Part1and2 is compressed with p(1)=0.25, p(0)=0.75 and H(p)=0.81. In parallel with the output of compressed combined partial page CPart1and2, sensing with Ref$_{1,2}$ is performed, and partial page Page$_{1,2}$ is reduced and compressed in a manner similar to that discussed above with respect to the MSB and CSB pages. After three reference comparisons, the memory device 2000 outputs a page having a size that is 0.9×0.75=0.68 (i.e. 68%) of full page.

An improvement (i.e., reduction) in read latency may be expressed as the ratio: (read with partial page compression)/(conventional read). An analysis of the improvement in read latency is discussed below based on the following assumptions: a duration of single reference sensing, from performing the comparison operation at the memory cell array 2100 to storing the results in the buffer 123, (tREF) is 30 or 25 μs; and the tRC parameter varies between 1.25, 2.5 and 5 ns. In 4-level MLCs, only one page is accelerated (i.e., the page read with two reference voltages). In 8-level MLCs, all three pages are accelerated where MSB and CSB pages improve more than the LSB page. Results of the read acceleration analysis are shown below in tables 1-3.

TABLE 1

4-Levels Acceleration, MSB Page

| tRC [nS] | 8 KB Page | 16 KB Page |
|---|---|---|
| 1.25 | 1.05 | 1.09 |
| 2.5 | 1.09 | 1.15 |
| 5 | 1.15 | 1.23 |

TABLE 2

8-Levels Acceleration, MSB/CSB Pages

| tRC [nS] | 8 KB Page | 16 KB Page |
|---|---|---|
| 1.25 | 1.11 | 1.21 |
| 2.5 | 1.21 | 1.36 |
| 5 | 1.36 | 1.55 |

TABLE 3

8-Levels Acceleration, LSB Page

| tRC [nS] | 8 KB Page | 16 KB Page |
|---|---|---|
| 1.25 | 1.04 | 1.08 |
| 2.5 | 1.08 | 1.14 |
| 5 | 1.14 | 1.21 |

As is shown in Tables, 1-3, according to at least some example embodiments of the inventive concepts, the method of reading with partial page compression may have greater effect when page size grows. According to at least one example embodiment of the inventive concepts, an improvement limit may be based on the reference with minimum entropy H(p) and reduction R, and may be expressed by Equation (4) below:

$$\lim_{P_Z \to \infty} \frac{n t_{REF} + P_Z t_{RC}}{n t_{REF} + R \cdot H(p) P_Z t_{RC}} = \frac{1}{R \cdot H(p)}. \quad (4)$$

As is shown in Tables, 1-3, according to at least some example embodiments of the inventive concepts, the method of reading with partial page compression may also have a greater effect when a number of bits per cell grows. For example, having more reference voltages allows the reference voltage with the lowest entropy to be chosen.

III. Compression Algorithm

Considerations for determining a manner in which to perform compression operations (e.g., steps S430 and S470 illustrated in FIG. 4A, and steps F2, F5, E4, and E6 of Algorithms 1 and 2) included in a read with partial page compression method according to at least some example embodiments will now be discussed below.

According to at least one example embodiment of the inventive concepts, at least one goal is the implementation of a compression algorithm that achieves near-entropy rate with low gate count. Since compression is implemented on the NAND chip (e.g., the memory device 2000), according to at least one example embodiment, Huffman code is chosen as an example compression code for use with read with partial page compression methods described herein and the compression encoder 129 illustrated in FIG. 1A in order to facilitate the construction of a relatively simple encoder.

According to at least some example embodiments, at least the following four source distributions are of interest:
1. Distribution $p(1)=0.2$, $p(0)=0.8$ which is experienced when performing comparison operations with reference voltages $Ref_{0,1}$ and $Ref_{6,7}$ while reading MSB and CSB pages of 8-level memory cells;
2. Distribution $p(1)=0.375$, $p(0)=0.625$ which is experienced when performing comparison operations with reference voltages $Ref_{4,5}$ and $Ref_{2,3}$ while reading MSB and CSB pages of 8-level memory cells;
3. Distribution $p(1)=0.25$, $p(0)=0.75$ which is experienced when performing comparison operations with reference voltages $Ref_{3,4}$ and $Ref_{4,6}$ while reading LSB pages of 8-level memory cells, and also MSB pages of 4-level memory cells; and
4. Distribution $p(1)=0.333$, $p(0)=0.666$ which is experienced when performing comparison operations with reference voltage $Ref_{1,2}$ while reading LSB pages of 8-level memory cells.

An analysis of the trade-off between implementation complexity and compression efficiency will now be discussed below.

Analysis of the above-referenced trade-off between implementation complexity and compression efficiency included, for each source distribution, calculating the probability distributions for word lengths of 2-6 bits. For each input word length and probabilities we designed Huffman code and derive the achieved compression ratio. As word length grows, a design of the compression encoder (e.g., the compression encoder 129) may have a higher gate count since the compression encoder has to choose from a larger set of word mapping. On the other hand, longer word lengths may get closer to source entropy.

FIG. 6 shows tables comparing analytic word lengths vs. compression ratio results. Referring to FIG. 6, items (a)-(b) in FIG. 6 are tables illustrating, with respect to each of the 4 distribution types discussed above: a number code words, a compression value, and gap from entropy value for a plurality for different lengths of input (i.e., Huffman compression operation input word lengths of 2, 3, 4, 5 and 6 bits). Based on a trade-off analysis, according to at least some example embodiment of the inventive concepts, a size of an input encoder word was chosen to be 3 bits for all source distributions. However, other sizes (e.g., 2, 3, 4 or more than 4 bits) may be used in accordance with the preferences of a manufacturer or user of the memory device 2000.

FIG. 7A shows tables explaining attributes of an example implementation of Huffman code for 3-bit inputs. Referring to FIG. 7A, items (a)-(b) in FIG. 7A are tables illustrating, with respect to each of the 4 distribution types discussed above: output bits, output length (in bits), probability of occurrence, and a value representing the product of the probability of occurrence and the output length for each possible 3-bit input word (i.e., '000', '001', '010', '011', '100', '101', '110', and '111'). FIG. 7B includes a table illustrating, with respect to distribution type $p(1)=0.125$, $p(0)=0.875$: a number code words, a compression value, and gap from entropy value for a plurality for different lengths of input (i.e., Huffman compression operation input word lengths of 2, 3, 4, 5 and 6 bits); and a table explaining attributes of an example implementation of Huffman code for 4-bit inputs, with respect to the distribution $p(1)=0.125$, $p(0)=0.875$, the attributes including: output bits, output length (in bits), probability of occurrence, and a value representing the product of the probability of occurrence and the output length for each possible 4-bit input word (i.e., '0000', '0001', '0010', '0011', '0100', '0101', '0110', '0111', '1000', '1001', '1010', '1011', '1100', '1101', '1110', and '1111').

A method of using partial pages generated during execution of a read with partial page compression operation, in accordance with at least some example embodiments, to determine soft information (e.g., log likelihood ratio (LLR) data) will now be discussed in greater detail below with reference to FIG. 8.

IV. Soft Information Extraction.

Raw data of a single reference comparison (e.g., the single reference comparisons performed in step S410 of FIG. 4A, step S450 of FIG. 4A, or any of steps (F1), (F3), (E2), (E3) or (E4) of Algorithms 1 and 2) can be used to extract soft information regarding log-likelihood ratio (LLR) of page bits. Methods of extracting soft information based on a single reference comparison in accordance with at least some example embodiments of the inventive concepts will be discussed below with reference to FIG. 8 and an MSB page of 8-level MLCs.

Figure 8:
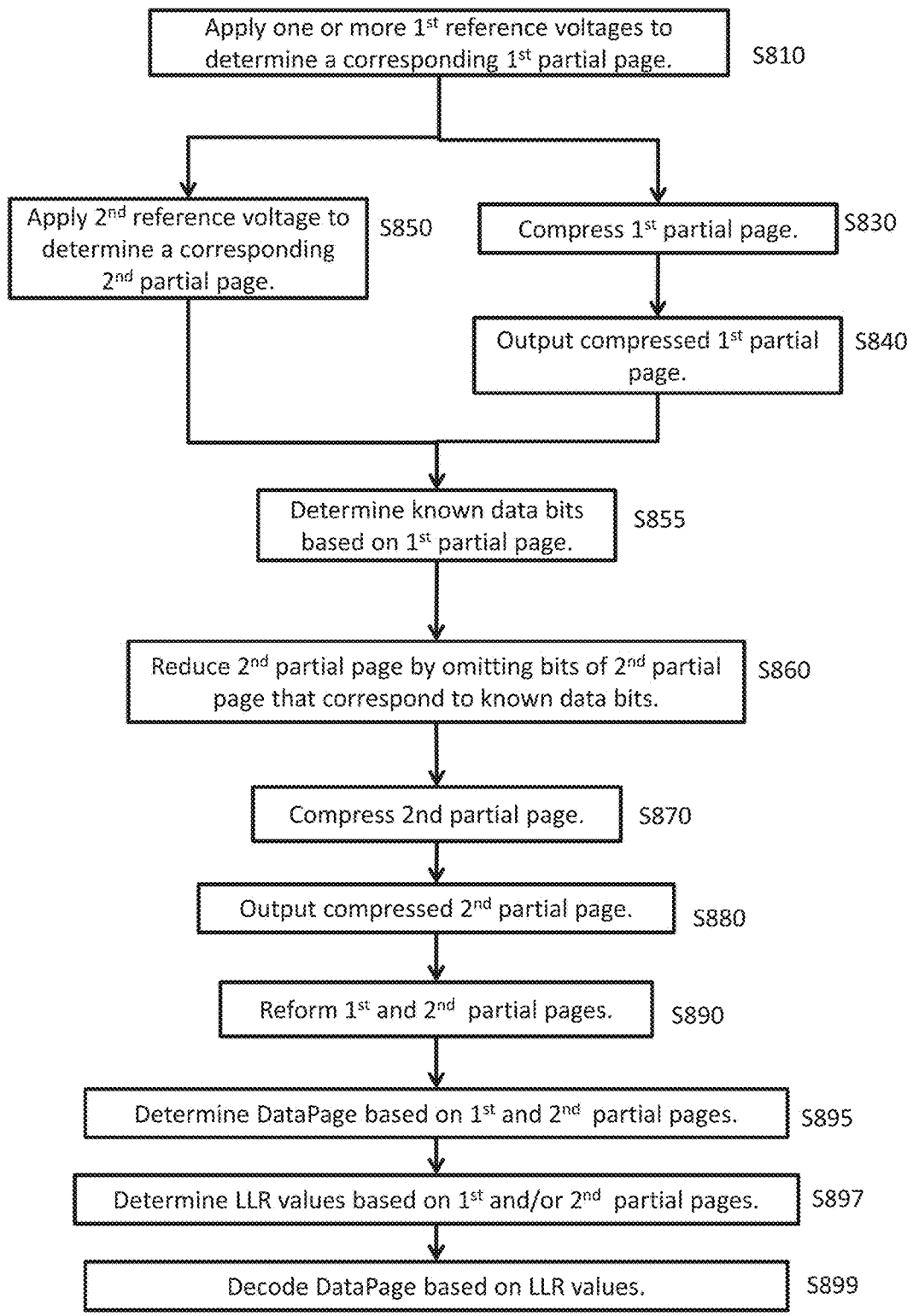
FIG. 8 is a flow chart illustrating a method for reading with partial page compression and soft data extraction according to at least one example embodiment of the inventive concepts.

FIG. 8 is a flow chart illustrating a method for reading with partial page compression and soft data extraction according to at least one example embodiment of the inventive concepts.

Steps S810-S895 in FIG. 8 are the same as steps S410-S495 discussed above with respect to FIG. 4A and Algorithm 1 with the exception that, in place of using reference voltages $Ref_{0,1}$ and $Ref_{2,3}$ illustrated in item (b) of FIG. 4C to perform comparison operations and read LSB page data of 4-level cells, in FIG. 8, the memory device 2000 uses reference voltages $Ref_{0,1}$ and $Ref_{4,5}$ illustrated in item (a) of FIG. 5B to perform comparison operations and read MSB page data of 8-level cells. Accordingly, the partial page generated by the memory device 2000 in step S810 is partial page $Page_{0,1}$ and the partial page generated by the memory device 2000 in step S850 is partial page $Page_{4,5}$. Similarly, the partial pages reformed by the controller 1000 (or host) in step S890, and used by the controller 1000 (or host) to determine the DataPage (i.e., the MSB page of a plurality of 8-level cells) in step S895 are partial pages $Page_{0,1}$ and $Page_{4,5}$.

Further, the method illustrated in FIG. 8 includes steps S897 and S899. In step S897, the controller 1000 may determine LLR values based on at least one of $1^{st}$ and $2^{nd}$ partial pages (i.e., at least one of $Page_{0,1}$ and $Page_{4,5}$).

For example the contents of partial page $Page_{0,1}$ (generated by performing a comparison operation between threshold voltages of a plurality of memory cells and reference voltage $Ref_{0,1}$) allows the controller 1000 to store information identifying, among '1' bits an MSB page of one or more 8-level cells, '1' bits that correspond to an erase state (i.e., state L0 illustrated in item (c) of FIG. 2). According to at least one example embodiment of the inventive concepts, the controller 1000 may regard the '1' bits that are determined to correspond to state L0 (based on a comparison operation using reference voltage $Ref_{0,1}$) to have much lower reliability than '1' bits that are determined to correspond to state L5, L6 or L7 based on a comparison operation using reference voltage Ref4-5. For example, the '1' bits at states L6 and L7 are reliable due to similar value at adjacent levels and, in general, possible error is relatively likely only at state L5. Therefore, a higher LLR value (thus indicating greater reliability) may be assigned to 1's that are sensed with Ref4-5. Further, the controller 1000 may assign an LLR value to an MSB page 0 (referred to as $LLR_0$) that is in between the LLR value assigned to an MSB page 1 determined based on reference voltage Ref0,1 (referred to as $LLR_1$ with $Ref_{0-1}$) and an LLR value assigned to an MSB page 1 determined based on reference voltage $Ref_{4,5}$ (referred to as $LLR_1$ with $Ref_{4-5}$) since the additional data discussed above with respect to the 1's of the MSB page of an 8-level cell does not necessarily exist in a similar form for the 0's of the MSB page of an 8-level cell. Thus, the above-referenced relationship between LLR values associated with different bits of an MSB page of an 8-level cell can be defined by equation (5) below:

$$LLR_{1 \text{ with } Ref_{0-1}} < LLR_0 < LLR_{1 \text{ with } Ref_{4-5}} \quad (5)$$

Accordingly, in step S897, the controller 1000 may determine LLR values for 1's and 0's of the DataPage (e.g., the MSB data page of a plurality of 8-level memory cells) based on Equation (5) above. For example, the microprocessor 111 may calculate the LLR values, and store the LLR values, for example, in the RAM 112.

Next, in step S899, the controller 1000 may decode the DataPage (e.g., the MSB data page of a plurality of 8-level memory cells) based on the LLR values determined in step S897. For example, the microcontroller 111 may control the decoder 1200 to perform LDPC decoding on the DataPage using the LLR values determined in step S897, in accordance with known methods of performing LDPC decoding using LLR values. The use of the LLR values generated as discussed above with respect to the method illustrated in FIG. 8 may result in improved LDPC decoding by the decoder 1200, as will now be discussed in greater detail below.

Based on the observations represented by equation (5) above, LDPC decoders were simulated with and without the above-referenced side information (i.e., LLR values) to analyze the reduction in the number of LDPC iterations needed to complete an LDPC decoding operation. The above-referenced simulation used LLR values ranging between 1-15. The selected LLR values were 3 for 1's of an MSB page determined using reference voltage $Ref_{0-1}$, 4 for 0's of the MSB page, and 5 for 1's of the MSB page determined using reference voltage Ref4-5. It was assumed that errors are uniformly distributed between program states that have bit transitions. According to the results of the above-referenced simulation, up to 10% reduction in the number of LDPC iterations needed to complete an LDPC decoding operation, and a corresponding power reduction, were observed.

Next, methods for dealing with bus transmission overhead will be discussed below.

V. Bus Transmission Overhead

Though the read with partial page compression methods, examples of which are discussed above with reference to FIGS. 4A and 8, and Algorithms 1 and 2, may result in less data being transmitted after a second read operation of a page read operation (e.g., a multiple comparison MSB page, CSB page or LSB page read operation) thereby providing read acceleration in comparison to a conventional read operation, the methods may also result in increased overall byte transmission per page in comparison to a conventional read operation when executed as part of a random page read operation. The increased overall byte transmission is referred to herein as a bus transmission penalty. As used herein, the term random page read operation refers to data page read operations that can be performed in any order because the results of one data page read operation are not dependent on those of another data page read operation (e.g., reading the MSB page before reading the LSB page, reading the LSB page before reading the MSB page, reading the CSB page before reading the MSB page which is read before the LSB page, etc.).

For example, using the threshold voltage to data value mapping illustrated in item (d) of FIG. 2, when reading an MSB or CSB page of a plurality of 8-level cells using the method illustrated above with reference to FIG. 4A, the transmission of the first partial page may have a size that is 95% the size of a transmission of a full MSB or CSB page, and the transmission of the second partial page may have a size that is 0.72×0.625=45% the size of a transmission of a full MSB or CSB page. A total transmission size of the first and second partial pages is thus 145% the size of a transmission of a full MSB or CSB page.

As another example, using the threshold voltage to data value mapping illustrated in item (d) of FIG. 2, when reading an LSB page of a plurality of 8-level cells using the method illustrated above with reference to FIG. 4A, the transmission of the first partial page may have a size that is 81% the size of a transmission of a full LSB page, and the transmission of the second partial page may have a size that is 0.9× 0.75=68% the size of a transmission of a full LSB page. A total transmission size of the first and second partial pages is thus 149% the size of a transmission of a full LSB page.

As another example, using the threshold voltage to data value mapping illustrated in item (b) of FIG. 2, when reading an MSB page of a plurality of 4-level cells using the method illustrated above with reference to FIG. 4A, the transmission of the first partial page may have a size that is 81% the size of a transmission of a full MSB page, and the transmission of the second partial page may have a size that is 0.9× 0.75=68% the size of a transmission of a full LSB page. A total transmission size of the first and second partial pages is thus 149% the size of a transmission of a full MSB page.

However, according to at least one example embodiment of the inventive concepts, in a sequential data page read operation the bus transmission penalty can be reduced or, alternatively, eliminated, and first bit latency may be accelerated to an even greater degree than that experienced with the random page read operations.

An example method for performing a sequential data page read operation will now be discussed below with reference to FIGS. 9 and 10A-C.

Figure 9:
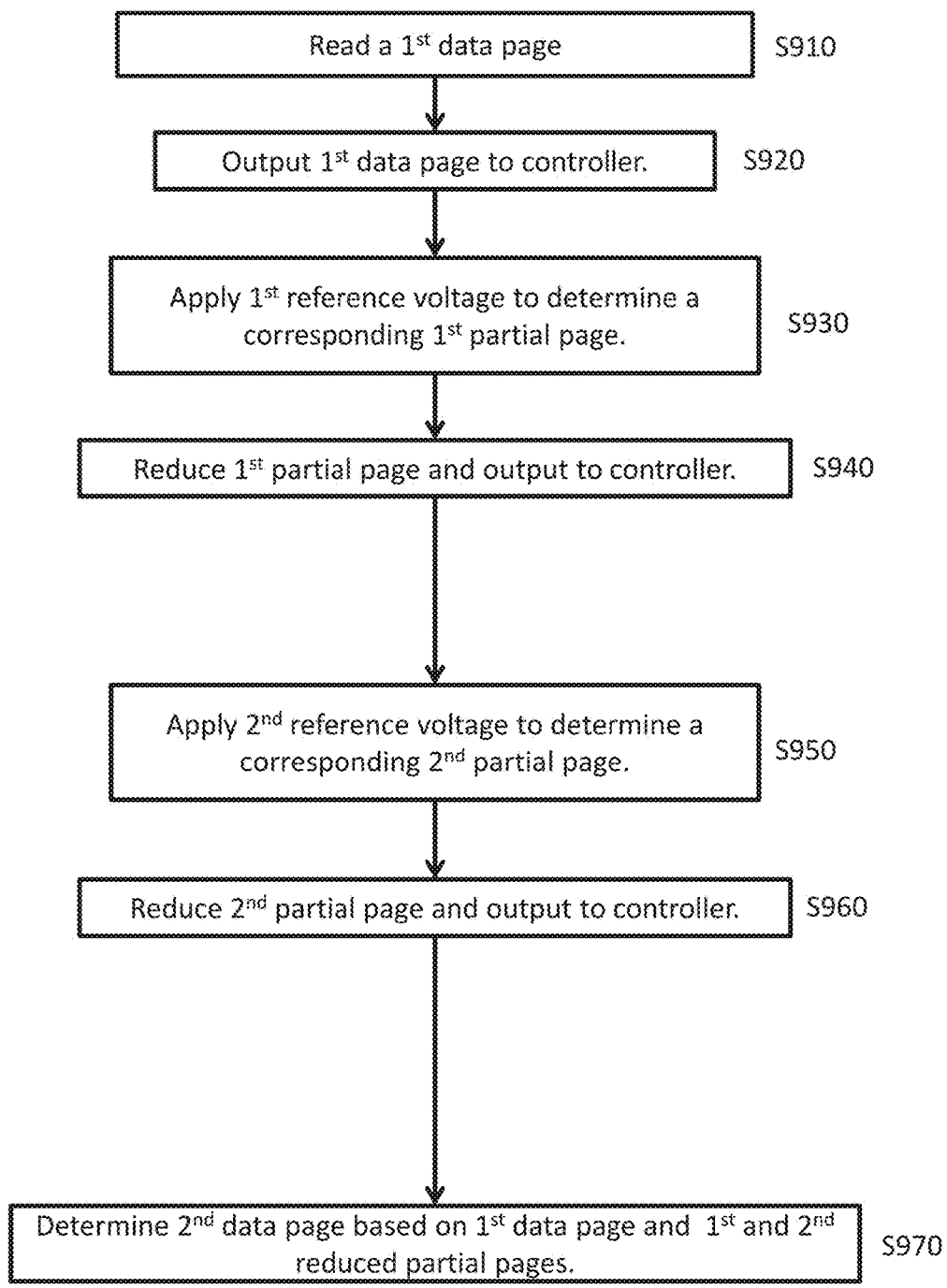
FIG. 9 is a flow chart illustrating a sequential data page reading method according to at least one example embodiment of the inventive concepts.

FIG. 9 is a flow chart illustrating a sequential data page reading method according to at least one example embodiment of the inventive concepts.

Figure 10A:
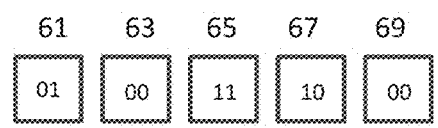
FIG. 10A illustrates the contents of example memory cells of the memory cell array illustrated in FIG. 1A.
Figure 10B:
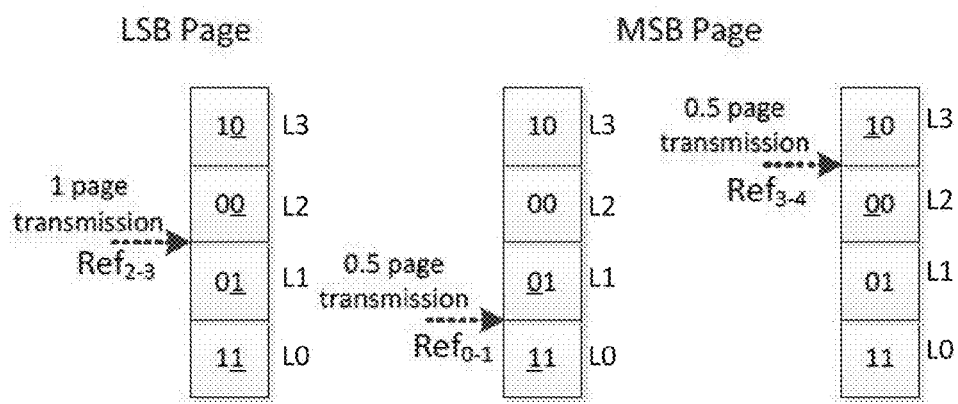
FIG. 10B is a diagram for explaining a sequential data page reading operation according to at least one example embodiment of the inventive concepts, with reference to LSB and MSB data page reading operations for MLCs storing 2-bit data.

FIG. 10A illustrates the contents of example memory cells of the memory cell array 2100 illustrated in FIG. 1A. FIG. 10B is a diagram for explaining a sequential data page reading operation according to at least one example embodiment of the inventive concepts, with reference to LSB and MSB data page reading operations for memory cells storing 2-bit data. FIG. 10C is a diagram for explaining the formation of partial pages in a read operation involving 4-level MLCs according to at least one example embodiment of the inventive concepts.

As is illustrated in FIG. 10A, example memory cells 60 include five cells, first example memory cell 61 storing data '01', second example memory cell 63 storing data '00', third example memory cell 65 storing data '11', fourth example memory cell 67 storing data '10', and fifth example memory cell 69 storing data '00'. Memory cells 60 may be, for example, five 4-level cells of Page 1 of first block 2120 of memory cell array 2100 illustrated in FIG. 1A. According to at least one example embodiment of the inventive concepts, memory cells 60 are located on the same word line as each other, from among the word lines of memory cell array 2100.

The data values illustrated in of FIG. 10B follow a different mapping of threshold voltage states to data values than that shown in item (b) of FIG. 2. As is illustrated in FIG. 10B, when a mapping of threshold voltage states to data values shown in FIG. 10B is used, the memory device 2000 can read an LSB page of 2-bit memory cells with one comparison (i.e., read) operation using the reference voltage $Ref_{2,3}$; and the memory device 2000 can read a MSB page of 2-bit memory cells with two comparison (i.e., read) operations using the reference voltages $Ref_{0,2}$ and $Ref_{3,4}$.

FIG. 9 will be explained with reference to an example where LSB and MSB data pages of the example memory cells 60 are read assuming a mapping of threshold voltage states to data values shown in FIG. 10B. Further, FIG. 9 will be explained with reference to an example where the following partial page mapping is used: a partial page $Page_{0,1}$ is generated by assigning a bit value of '1' to cells with threshold values below $Ref_{0,1}$ and assigning a bit value of '0' to cells with threshold values above $Ref_{0,1}$; and a partial page $Page_{3,4}$ is generated by assigning a bit value of '1' to cells with threshold values above $Ref_{3,4}$ and assigning a bit value of '0' to cells with threshold values below $Ref_{3,4}$.

Referring to FIG. 9, in step S910, the memory device 2000 reads a first data page. For example, in the example shown in FIG. 10B, in step S910 the memory device 2000 reads the LSB data page of memory cells 60 by comparing the threshold voltages of memory cells 60 to reference voltage $Ref_{2,3}$. As is shown in FIG. 10C, the memory device 2000 generates the LSB data page of memory cells 60 as: "10100".

In step S920, the memory device 2000 outputs the first data page to the controller (or host). For example, in step S920, the memory device 2000 (e.g., the control logic 126) controls the I/O buffer 124 to output the LSB data page of the memory cells 60 to the controller 1000 via the I/O pad 127 and the memory system bus 800, and the controller 1000 (or a host) receives and stores the LSB data page (e.g., in the RAM 112).

In step S930, the memory device 2000 applies a $1^{st}$ reference voltage to determine a $1^{st}$ corresponding partial page. For example, in step S930 the memory device 2000 may generate comparison results by performing a comparison of the threshold voltages of the memory cells 40 to the reference voltage $Ref_{0,1}$ thereby generating partial page $Page_{0,1}$ including bits "00100" as is shown in FIG. 10C. Specifically, only one of memory cells 60 (third memory cell 65) stores data corresponding to a threshold voltage below reference voltage $Ref_{0,1}$. Accordingly, bits of partial page $Page_{0,1}$ corresponding to all of memory cells 60 except third memory cell 65 are '0', and the bit of partial page $Page_{0,1}$ corresponding to third memory cell 65 is '1'. In step S930, after generating partial page $Page_{0,1}$, the memory device 2000 may store partial page $Page_{0,1}$, for example, in page buffer 123.

In step S940, the memory device 2000 reduces the $1^{st}$ partial page and outputs the reduced $1^{st}$ partial page to the controller (or host). For example, based on the determination of the LSB data page of memory cells 60 in step S910, which included comparing threshold voltages of memory cells 60 to reference voltage $Ref_{1,2}$, the memory device 2000 knows which of memory cells 60 have threshold voltage states above reference voltage $Ref_{1,2}$ and which of memory cells 60 have threshold voltage states below reference voltage $Ref_{1,2}$.

Accordingly, in step S940, the memory device 2000 may generate reduced partial page $RPage_{0,1}$ including bits "01", as illustrated in FIG. 10C, by omitting the bits of partial page $Page_{0,1}$ that correspond to memory cells, from among memory cells 60, having an LSB of '0' (i.e., the second, fourth and fifth bits of partial page $Page_{0,1}$). The omitted bits are illustrated with bold X's in FIG. 10C. As is illustrated in FIG. 10C, reduced partial page $RPage_{0,1}$ has fewer bits (i.e., 2 bits) than partial page $Page_{0,1}$ (i.e., 5 bits). Further, as is illustrated in FIG. 10C, partial page $Page_{0,1}$ has been reduced such that the bits of reduced partial page $RPage_{0,1}$ are the MSB bits of the corresponding memory cells (i.e., the MSB bits of first and third memory cells 61 and 65 are '0' and '0'). In step S940, the memory device 2000 (e.g., the control logic 126) may control the page buffer 123 to store reduced partial page $RPage_{0,1}$.

Further, in step S940, the memory device 2000 outputs the reduced partial page $RPage_{0,1}$. For example, the memory device 2000 (e.g., the control logic 126) controls the I/O buffer 124 to output reduced partial page $RPage_{0,1}$ of the memory cells 60 to the controller 1000 via the I/O pad 127 and the memory system bus 800, and the controller 1000 (or a host) receives and stores the LSB data page (e.g., in the RAM 112).

In step S950, the memory device 2000 applies a $2^{nd}$ reference voltage to determine a $2^{nd}$ corresponding partial page. For example, in step S950 the memory device 2000 may generate comparison results by performing a comparison of the threshold voltages of the memory cells 40 to the reference voltage $Ref_{3,4}$ thereby generating partial page $Page_{3,4}$ including bits "00010" as is shown in FIG. 10C. Specifically, only one of memory cells 60 (fourth memory cell 67) stores data corresponding to a threshold voltage above reference voltage $Ref_{3,4}$. Accordingly, bits of partial page $Page_{3,4}$ corresponding to all of memory cells 60 except fourth memory cell 67 are '0', and the bit of partial page $Page_{3,4}$ corresponding to fourth memory cell 67 is '1'. In step S950, after generating partial page $Page_{3,4}$, the memory device 2000 may store partial page $Page_{3,4}$, for example, in page buffer 123.

In step S960, the memory device 2000 reduces the $2^{nd}$ partial page and outputs the reduced $2^{nd}$ partial page to the controller (or host). For example, based on the determination of the LSB data page of memory cells 60 in step S910, which included comparing threshold voltages of memory cells 60 to reference voltage $Ref_{1,2}$, the memory device 2000 knows which of memory cells 60 have threshold voltage states above reference voltage $Ref_{1,2}$ and which of memory cells 60 have threshold voltage states below reference voltage $Ref_{1,2}$.

Accordingly, in step S960, the memory device 2000 may generate reduced partial page $RPage_{3,4}$ including bits "010", as illustrated in FIG. 10C, by omitting the bits of partial page $Page_{3,4}$ that correspond to memory cells, from among memory cells 60, having an LSB of '1' (i.e., the first and third bits of partial page $Page_{3,4}$). The omitted bits are illustrated with bold X's in FIG. 10C. As is illustrated in FIG. 10C, reduced partial page $RPage_{3,4}$ has fewer bits (i.e., 3 bits) than partial page $Page_{3,4}$ (i.e., 5 bits). Further, as is illustrated in FIGS. 10A and 10C, partial page $Page_{3,4}$ is reduced such that the bits of reduced partial page $RPage_{3,4}$ are the MSB bits of the corresponding memory cells (i.e., the MSB bits of second, fourth, and fifth memory cells 63, 67 and 69 are '0', '1', and '0'). In step S960, the memory device 2000 (e.g., the control logic 126) may control the page buffer 123 to store reduced partial page $RPage_{3,4}$.

Further, in step S960, the memory device 2000 outputs the reduced partial page $RPage_{3,4}$. For example, the memory device 2000 (e.g., the control logic 126) controls the I/O buffer 124 to output reduced partial page $RPage_{3,4}$ of the memory cells 60 to the controller 1000 via the I/O pad 127 and the memory system bus 800, and the controller 1000 (or a host) receives and stores the LSB data page (e.g., in the RAM 112).

In step S970, the controller 1000 (or a host) determines a $2^{nd}$ data page based on the $1^{st}$ data page and the $1^{st}$ and $2^{nd}$ reduced partial pages. For example, upon receiving the LSB data page in step S920, the controller 1000 can store the LSBs of the memory cells 60 (e.g., in the RAM 112). Further, the controller 1000 can store information indicating which of the memory cells 60 were storing LSBs of '1' and which of the memory cells 60 were storing LSBs of '0'. Further, the controller 1000 may store ordering information indicating a particular order in which the $1^{st}$ and $2^{nd}$ partial pages are to be received by the controller 1000 from the memory device 2000 (e.g., in the RAM 112 or the ROM 113).

Accordingly, based on the ordering information and the information indicating which of the memory cells 60 store an LSB of '1', the controller 1000 can generate a portion of the MSB page of the memory cells 60 by assigning the bits of the reduced partial page $RPage_{0,1}$ to positions in the MSB page that correspond to positions in the LSB page that store 1's. As is illustrated in FIG. 10C, the first and third bit positions in the LSB data page of the memory cells 60 are 1's. Accordingly, the controller 1000 assigns the two bits included in the reduced partial page $RPage_{0,1}$ (i.e., "01") to first and third bit positions in the MSB data page, respectively.

Similarly, based on the ordering information and the information indicating which of the memory cells 60 store an LSB of '0', the controller 1000 can generate a remaining portion of the MSB page of the memory cells 60 by assigning the bits of the reduced partial page $RPage_{3,4}$ to positions in the MSB page that correspond to positions in the LSB page that store 0's. As is illustrated in FIG. 10C, the second, fourth and fifth bit positions in the LSB data page of the memory cells 60 are 0's. Accordingly, the controller 1000 assigns the three bits included in the reduced partial page $RPage_{3,4}$ (i.e., "010") to the second, fourth and fifth bit positions in the MSB data page, respectively.

Accordingly, as is discussed above, the controller 1000 uses the reduced partial page $RPage_{0,1}$ together with reduced partial page $RPage_{3,4}$ to generate first through fifth bits of the MSB page of the memory cells 60 as "00110".

Accordingly, based on the method illustrated in FIG. 9, the total size of the information that the memory device 2000 sent to the controller 1000 was equal to 2 data pages (i.e., 5 bits sent in step S920+2 bits sent in step S940+3 bits sent in step S960=10 bits total sent, where a data page for 5 memory cells has a size of 5 data bits). Further, the total number of pages the controller 1000 built based on the information received from the memory device 2000 was 2 pages (i.e., the LSB page of the memory cells 60 and the MSB page of the memory cells 60). Accordingly, a total size of the information sent by the memory device 2000 to the controller 1000 over the memory system bus 800 (i.e., 2 data pages or 10 bits) is equal to a total size of the information built at the controller 1000 (i.e., 2 data pages or 10 bits). Thus, the above-referenced bus transmission penalty is reduced or, alternatively, eliminated by using the sequential data page read operation according to at least some example embodiments of the inventive concepts, as explained above with reference to FIG. 9.

With respect to larger sets of memory cells (e.g., a thousand or more memory cells), a size of transmission of bits in step S920 (i.e., a size reduced partial page $RPage_{1,0}$) will be about 50% of the size of a data page corresponding to the memory cells, and a size of transmission of bits in step S940 (i.e., a size reduced partial page $RPage_{3,4}$) will also be about 50% of the size of a data page corresponding to the memory cells.

The read latency reduction associated with the sequential data page read operation according to one or more example embodiments of the inventive concepts is, for example, $$\frac{2t_{REF} + P_Z t_{RC}}{2t_{REF} + 0.5 P_Z t_{RC}}$$

for 4-level memory cells, compared to $$\frac{2t_{REF} + P_Z t_{RC}}{2t_{REF} + 0.68 P_Z t_{RC}}$$

for a random page read operation for 4-level memory cells.

Though the sequential data page read method illustrated in FIG. 9 is explained with reference to an example where LSB and MSB data pages are read from 4-level (i.e., 2-bit) MLC memory cells, according to at least one example embodiment of the inventive concepts the method illustrated in FIG. 9 may also be applied to reading MSB, CSB, and/or LSB data pages of MLC memory cells other than 4-level memory cells (e.g., 8-level memory cells).

For example, using the threshold voltage to data value mapping illustrated in FIG. 5B with reference to 8-level memory cells, first the memory device 2000 reads an LSB page of a plurality of 8-level memory cells, which includes comparing threshold voltages of the memory cells to reference voltage $Ref_{3-4}$. Next, the memory device 2000 reads a portion of a CSB page of the memory cells by performing a comparison operation using reference voltage $Ref_{2-3}$ to generate a partial page $Page_{2-3}$. The memory device 2000 then reduces partial page $Page_{2-3}$ to generate reduced partial page $RPage_{2-3}$ by omitting bits of partial page $Page_{2-3}$ that correspond to memory cells that were determined to have threshold voltage states above reference voltage $Ref_{3-4}$. Accordingly, for large numbers of memory cells, the reduced partial page RPage$_{2-3}$ will have a size of around 50% of a data page of the memory cells, because about half of a given group of memory cells is expected to have threshold voltage states above reference voltage Ref$_{3-4}$ (i.e., as is illustrated in FIG. 5B, the program states L4-L7 are half of all the program states for 8-level cells).

Next, the memory device 2000 reads a portion of a CSB page of the memory cells by performing a comparison operation using reference voltage Ref$_{6-7}$ to generate a partial page Page$_{6-7}$. The memory device 2000 then reduces partial page Page$_{6-7}$ to generate reduced partial page RPage$_{6-7}$ by omitting bits of partial page Page$_{6-7}$ that correspond to memory cells that were determined to have threshold voltage states below reference voltage Ref$_{3-4}$. Accordingly, for large numbers of memory cells, the reduced partial page RPage$_{6-7}$ will have a size of around 50% of a data page of the memory cells, because about half of a given group of memory cells is expected to have threshold voltage states below reference voltage Ref$_{3-4}$ (i.e., as is illustrated in FIG. 5B, the program states L0-L3 are half of all the program states for 8-level cells).

In the same manner discussed above with respect to steps S940, S960 and S970 in FIG. 9, the reduced partial page RPage$_{2-3}$ is generated by the memory controller 2000 such that the bits of the reduced partial page RPage$_{2-3}$ are the CSB bits of the memory cells corresponding to the bits of the reduced partial page RPage$_{2-3}$. Similarly, the reduced partial page RPage$_{6-7}$ is generated by the memory controller 2000 such that the bits of the reduced partial page RPage$_{6-7}$ are the CSB bits of the memory cells corresponding to the bits of the reduced partial page RPage$_{6-7}$.

The memory device 2000 sends the reduced partial page RPage$_{2-3}$ and the reduced partial page RPage$_{6-7}$ to the controller 1000. The controller 1000 receives and stores the reduced partial page RPage$_{2-3}$ and the reduced partial page RPage$_{6-7}$, and then determines the CSB data page of the 8-level memory cells in the same manner discussed above in step S970 of FIG. 9 with respect to the MSB data page of the 4-level memory cells 60.

The MSB page of the 8-level memory cells may be read using a sequential data page read operation in the same manner discussed above with respect to the explanation of reading a CSB page of the 8-level memory cells using a sequential data page read operation, for example, by using reference voltages Ref$_{4-5}$ and Ref$_{0-1}$. Reduced data pages RPage$_{4-5}$ and RPage$_{0-1}$ will each have a size of around 50% of a data page. According to at least some example embodiments of the inventive concepts, not all three pages (i.e., MSB, LSB, and CSB pages) have to be read in order to reduce or, alternatively, eliminate the bus transmission penalty with respect to 8-level memory cells, and it may be sufficient that two out of three data pages are read to reduce bus overhead.

Figure 11:
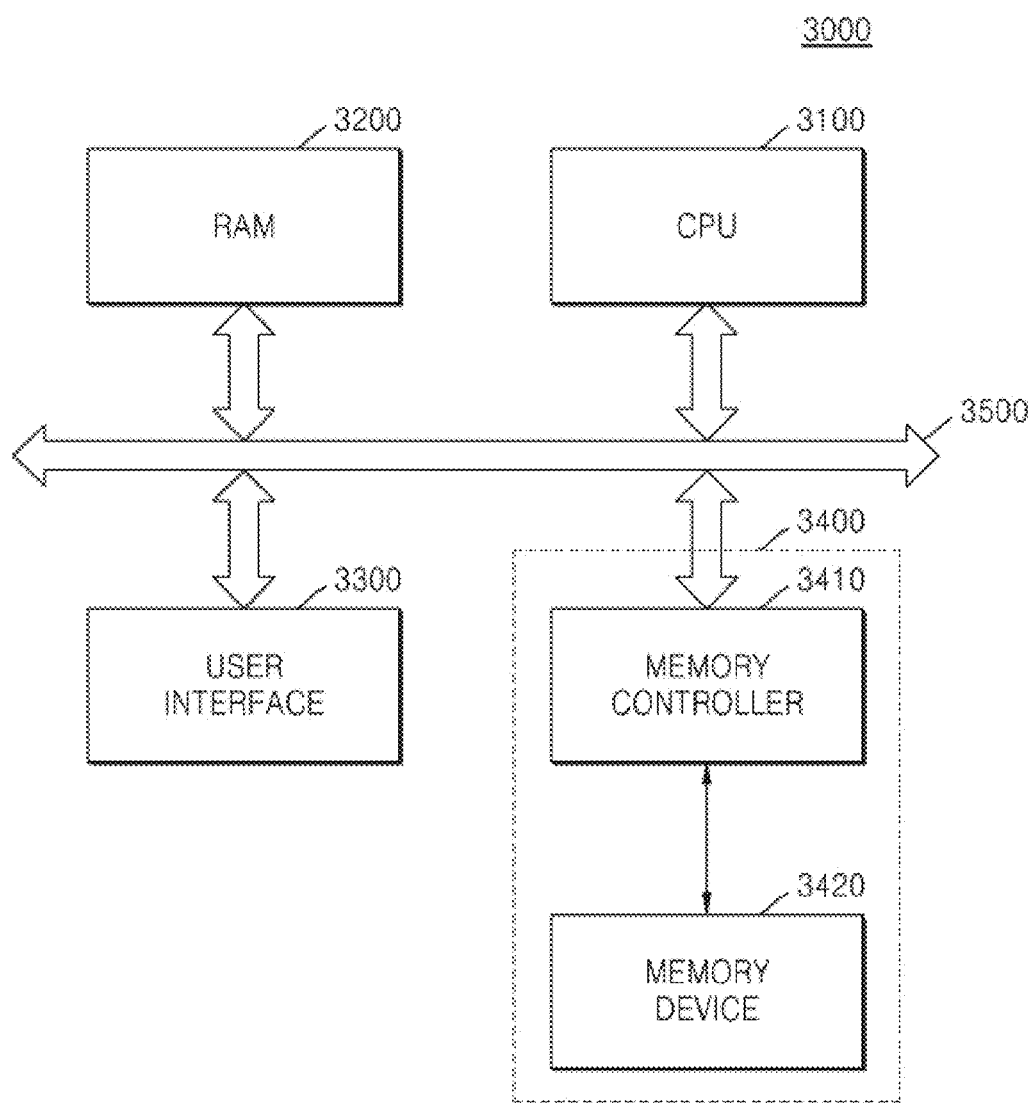
FIG. 11 is a block diagram showing a computer system including a memory system according to example embodiments of inventive concepts.

FIG. 11 is a block diagram showing a computer system 3000 including a memory system according to at least one example embodiment of the inventive concepts. The computer system 3000, which may be embodied by, for example, a mobile device, a desktop computer, or a server, may employ a memory system 3400 according to at least one example embodiment of the inventive concepts.

The computer system 3000 may include a central processing unit (CPU) 3100, a RAM 3200, a user interface 3300, and the memory system 3400, each of which is electrically connected to buses 3500. The host as described above may include the central processing unit 3100, the RAM 3200, and the user interface 3300 in the computer system 3000. The central processing unit 3100 may control the entire computer system 3000 and may perform calculations corresponding to user commands input via the user interface 3300. The RAM 3200 may function as a data memory for the central processing unit 3100, and the central processing unit 3100 may write/read data to/from the memory system 3400.

As in example embodiments of inventive concepts described above, the memory system 3400 may include a memory controller 3410 and a memory device 3420. The memory controller 3410 may include an encoder and a decoder, and the memory device 3420 may include a cell array including a plurality of memory cells.

According to at least one example embodiment of the inventive concepts, the memory controller 3410 and the memory device 3420 may be implemented, respectively, by the memory controller 1000 and a memory device 2000 discussed above with reference to FIGS. 1A-10C.

Figure 12:
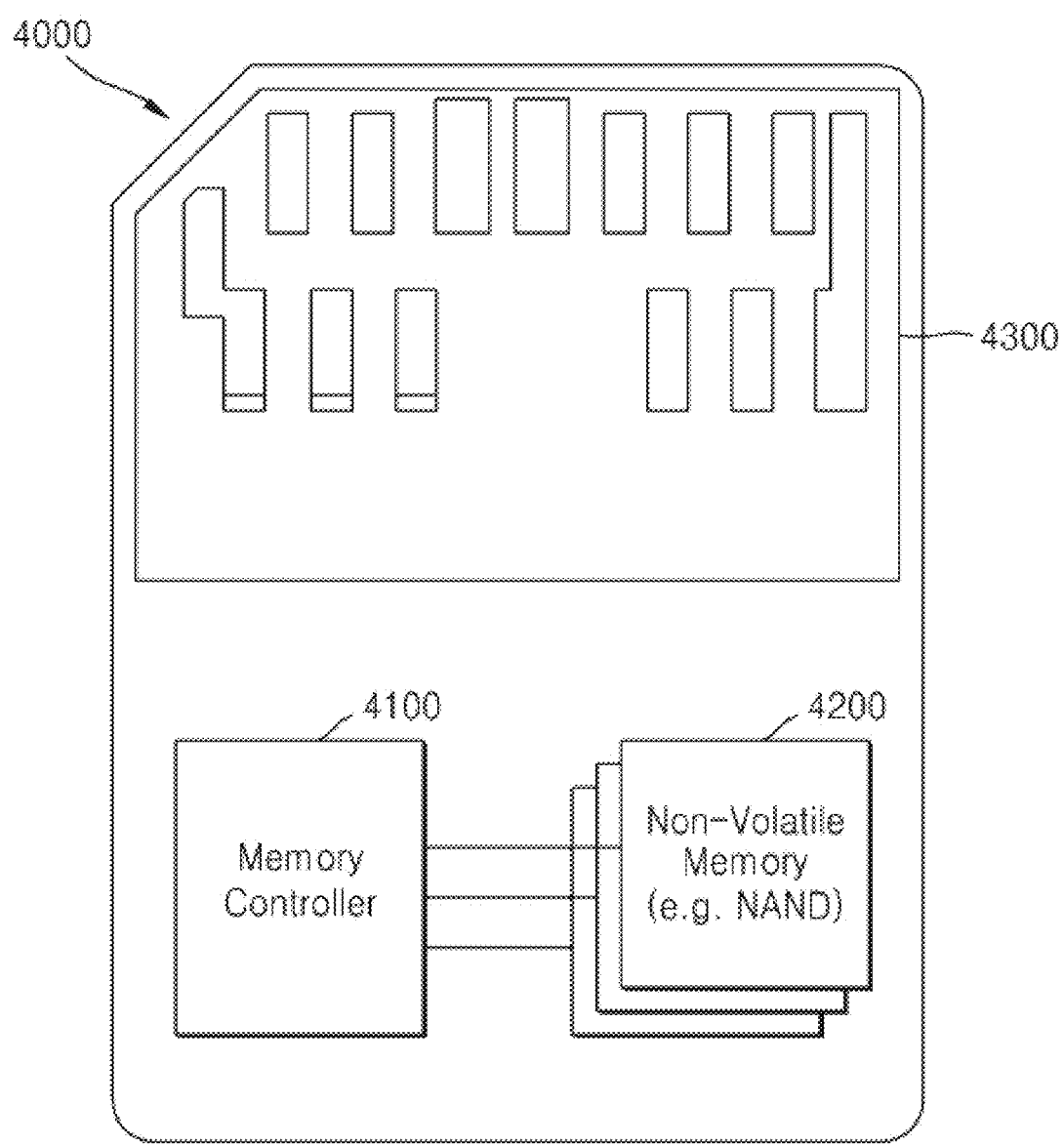
FIG. 12 is a block diagram showing a memory card according to at least one example embodiment of the inventive concepts.

FIG. 12 is a block diagram showing a memory card 4000 according to at least one example embodiment of the inventive concepts. A memory system 900 according to example embodiments of inventive concepts discussed above with reference to FIGS. 1A-10C may be the memory card 4000. For example, the memory card 4000 may include an Embedded MultiMediaCard (e.MMC) or a Secure Digital (SD) card. As shown in FIG. 12, the memory card 4000 may include a memory controller 4100, a non-volatile memory 4200, and a port region 4300. A memory device 2000 according to example embodiments of inventive concepts discussed above with reference to FIGS. 1A-10C may be the non-volatile memory 4200 shown in FIG. 12.

The memory controller 4100 may include an encoder and a decoder. The encoder and the decoder may perform an encoding method and a decoding method according to example embodiments of inventive concepts. The memory controller 4100 may communicate with an external host via the port region 4300 in compliance with a pre-set protocol. The protocol may be e.MMC protocol, SD protocol, SATA protocol, SAS protocol, or USB protocol. The non-volatile memory 4200 may include memory cells which retain data stored therein even if power supplied thereto is blocked. For example, the non-volatile memory 4200 may include a flash memory, a magnetic random access memory (MRAM), a resistance RAM (RRAM), a ferroelectric RAM (FRAM), or a phase change memory (PCM).

According to at least one example embodiment of the inventive concepts, the memory controller 4100 and a memory device 4200 may be implemented, respectively, by the memory controller 1000 and a memory device 2000 discussed above with reference to FIGS. 1A-10C.

Figure 13:
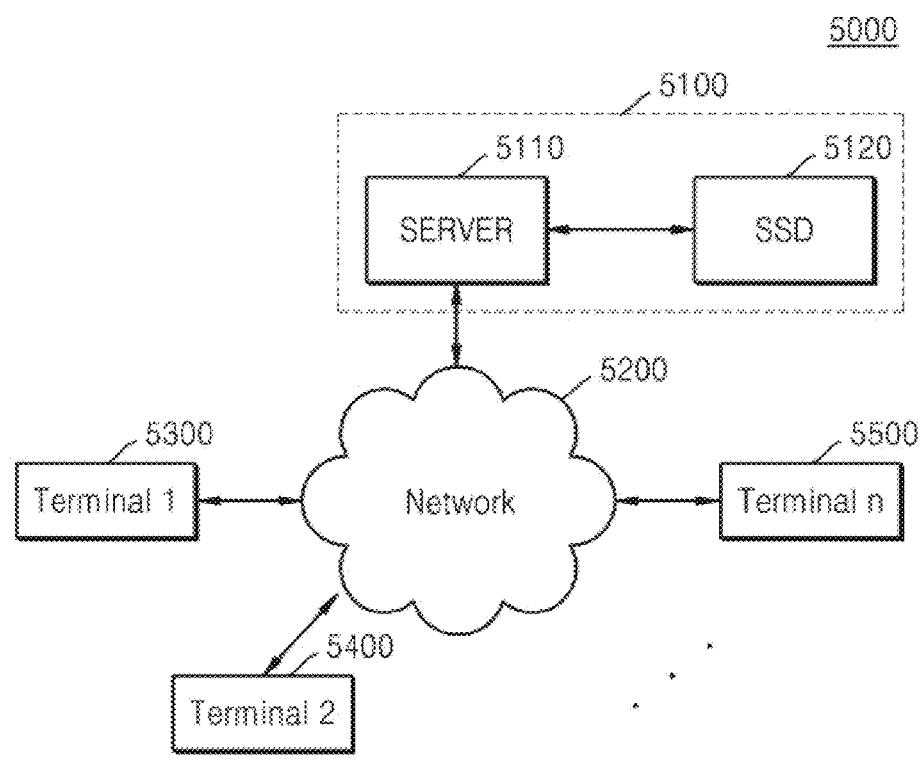
FIG. 13 is a block diagram showing an example network system including a memory system according to at least one example embodiment of the inventive concepts.

FIG. 13 is a block diagram showing an example network system 5000 including a memory system according to at least one example embodiment of the inventive concepts. As shown in FIG. 13, the network system 5000 may include a server system 5100 and a plurality of terminals 5300, 5400, and 5500 that are connected via a network 5200. The server system 5100 may include a server 5110 for processing requests received from the plurality of terminals 5300, 5400, and 5500 connected to the network 5200 and a SSD 5120 for storing data corresponding to the requests received from the terminals 5300, 5400, and 5500. Here, the SSD 5120 may be a memory system according to at least one example embodiment of the inventive concepts.

According to at least one example embodiment of the inventive concepts, SSD 5120 may be implemented by the memory system 900 discussed above with reference to FIGS. 1A-10C.

Meanwhile, a memory system according to example embodiments of inventive concepts may be mounted via any of various packages. For example, a memory system according to at least one example embodiment of the inventive concepts may be mounted via any of packages including package on package (PoP), ball grid arrays (BGAs), chip scale packages (CSPs), plastic leaded chip Carrier (PLCC), plastic dual in-line package (PDIP), die in waffle pack, die in wafer form, chip on board (COB), ceramic dual in-line package (CERDIP), plastic metricquad flat pack (MQFP), thin quad flatpack (TQFP), small outline integrated circuit (SOIC), shrink small outline package (SSOP), thin small outline package (TSOP), thin quad flatpack (TQFP), system in package (SIP), multi chip package (MCP), wafer-level fabricated package (WFP), wafer-level processed stack package (WSP), etc.

It should be understood that example embodiments described herein should be considered in a descriptive sense only and not for purposes of limitation. Descriptions of features or aspects within each embodiment should typically be considered as available for other similar features or aspects in other example embodiments.

What is claimed is:

1. A memory system comprising:
a memory device, the memory device including,
a memory cell array, and
a compression encoder,
the memory cell array including a first plurality of multi level cells (MLCs),
the memory device being configured to:
generate a first partial page by performing one or more first sensing operations on the first plurality of MLCs using one or more first reference voltages,
output the first partial page,
generate a second partial page by performing a second sensing operation on the first plurality of MLCs based on a second reference voltage, the second reference voltage having a different voltage level than the one or more first reference voltages,
generate a compressed second partial page by compressing the second partial page using the compression encoder, and
output the compressed second partial page,
wherein the memory system further comprises:
a memory controller configured to:
receive the first partial page output from the memory device,
receive the compressed second partial page output from the memory device,
decompress the compressed second partial page, and
generate a first data page of the first plurality of MLCs based on the first partial page and the decompressed second partial page, the first data page being one of a most significant bit (MSB) page, a least significant bit (LSB) page, or a central significant bit (CSB) page of the first plurality of MLCs,
wherein the memory controller is configured to generate the first data page by performing one or more arithmetic operations based on the first partial page and the decompressed second partial page,
wherein the memory device is configured to:
determine one or more known data values based on the first partial page, and
generate a reduced second partial page by omitting one or more bits of the second partial page generated by the memory device, such that,
the one or more omitted bits are bits that correspond to the one or more known data values,
the reduced second partial page includes no bits of data corresponding to MLCs, from among the first plurality of MLCs, that correspond to the one or more known data values, and
the second partial page compressed by the memory device to generate the compressed second partial page is the reduced second partial page.

2. The memory system of claim 1 wherein the memory device is configured such that,
the first partial page includes information for generating a first data page of the first plurality of MLCs,
the second partial page includes information for generating the first data page of the first plurality of MLCs, and
the first data page is one of a most significant bit (MSB) page, a least significant bit (LSB) page, or a central significant bit (CSB) page of the first plurality MLCs.

3. The memory system of claim 1 wherein,
the compression encoder is configured to compress information using Huffman encoding, and
the memory device is further configured to generate a compressed first partial page by compressing the first partial page generated by the memory device such that the first partial page output by the memory device is the compressed first partial page.

4. The memory system of claim 3 wherein,
the memory device is configured to perform the compression of the first partial page in parallel with performing the second sensing operation.

5. The memory system of claim 4 wherein,
the memory device further includes a page buffer configured to receive the first partial page generated by the one or more first sensing operations and the second partial page generated by the second sensing operation from the memory cell array.

6. The memory system of claim 1 wherein the memory controller is further configured to:
determine log likelihood ratio (LLR) information based on at least one of the first partial page and the decompressed second partial page, and
generate the first data page of the first plurality of MLCs based on the first partial page, the decompressed second partial page, and the determined LLR information.

7. The memory system of claim 1 further comprising:
a memory system bus,
wherein the memory device is configured to output the first partial page to the memory controller via the memory system bus, and
the memory device is configured to output the compressed second partial page to the memory controller via the memory system bus, after outputting the first partial page to the memory controller via the memory system bus.

8. The memory system of claim 1, wherein the memory controller is configured to:
determine the one or more known data values based on the first partial page received by the memory controller, and
generate the first data page by performing one or more arithmetic operations based on the first partial page, the decompressed second partial page, and the one or more known data values.

9. A memory system comprising:
a memory device, the memory device including,
a memory cell array, the memory cell array including a first plurality of multi level cells (MLCs), the memory device being configured to:
  generate a first partial page by performing one or more first sensing operations on the first plurality of MLCs using one or more first reference voltages,
  determine one or more known data values based on the first partial page,
  output the first partial page,
  generate a second partial page by performing a second sensing operation on the first plurality of MLCs based on a second reference voltage, the second reference voltage having a different voltage level than the one or more first reference voltages,
  generate a reduced second partial page by omitting one or more bits of the second partial page generated by the memory device based on the known data values, and
  output the reduced second partial page.

10. The memory system of claim 9 further comprising:
a memory controller configured to:
  receive the first partial page output from the memory device,
  determine the one or more known data values based on the received first partial page,
  receive the reduced second partial page output from the memory device, and
  generate a first data page of the first plurality of MLCs based on the first partial page, the reduced second partial page, and the one or more known data values, the first data page being one of a most significant bit (MSB) page, a least significant bit (LSB) page, or a central significant bit (CSB) page of the first plurality of MLCs.

11. The memory system of claim 10 further comprising:
a memory system bus,
wherein the memory device is configured to output the first partial page to the memory controller via the memory system bus, and
the memory device is configured to output the reduced second partial page to the memory controller via the memory system bus, after outputting the first partial page to the memory controller via the memory system bus.

12. The memory system of claim 9, wherein the memory device is configured such that,
  the second partial page generated by the memory device includes a bit of binary information for each cell in the first plurality of MLCs, respectively, and
  the reduced second partial page includes a bit of binary information for each cell in the first plurality of MLCs except one or more cells of the first plurality of MLCs that correspond to the one or more known data values.

13. The memory system of claim 12, wherein the memory device is configured such that the reduced second partial page includes no bits of binary information for any cell or cells in the first plurality of MLCs that correspond to the one or more known data values.

14. The memory system of claim 12 wherein,
  the memory device includes a compression encoder, and
  the memory device is configured to generate a compressed reduced second partial page by compressing the reduced second partial page generated by the memory device,
  the reduced second partial page output by the memory device being the compressed reduced second partial page.

15. A memory system comprising:
a memory device, the memory device including,
  a memory cell array,
  the memory cell array including a first plurality of multi level cells (MLCs),
  the memory device being configured to:
    generate a first data page of the first plurality of MLCs by performing one or more first sensing operations on the first plurality of MLCs using at least a first reference voltage, the first data page being a data page of a first data page type, the first data page type being one of a most significant bit (MSB) page type, least significant bit (LSB) page type, or a central significant bit (CSB) page type,
    output the first data page,
    sense a first partial page by performing a second sensing operation on the first plurality of MLCs based on a second reference voltage, the second reference voltage having a different voltage level than the first reference voltage,
    sense a second partial page by performing a third sensing operation on the first plurality of MLCs based on a third reference voltage, the third reference voltage having a different voltage level than the first and second reference voltages,
    output, as a first reduced partial page, all bits of the sensed first partial page except bits sensed from MLCs, of the plurality of MLCs, determined by the memory device to store a threshold voltage state that is above the first reference voltage, and
    output, as a second reduced partial page, all bits of the sensed second partial page except bits sensed from MLCs, of the plurality of MLCs, determined by the memory device to store a threshold voltage state that is below the first reference voltage.

16. The memory system of claim 15 further comprising:
a memory controller configured to:
  receive the first data page output from the memory device,
  determine first information based on the received first data page, the first information indicating which of the first plurality of MLCs have a threshold voltage above the first reference voltage and which of the first plurality of MLCs have a threshold voltage below the first reference voltage,
  receive the first and second reduced partial pages output from the memory device, and
  generate a second data page of the first plurality of MLCs based on the first reduced partial page, the second reduced partial page, and the first information,
  the second data page being a data page of a second data page type,
  the second data page type being one of a most significant bit (MSB) page type, a least significant bit (LSB) page type, or a central significant bit (CSB) page type,
  the second data page type being different than the first data page type.

17. The memory system of claim 16 further comprising:
a memory system bus,
wherein the memory device is configured to output the first data page, and the first and second reduced partial pages, to the memory controller via the memory system bus.

* * * * *